(12) United States Patent
Shimizu et al.

(10) Patent No.: US 6,597,063 B1
(45) Date of Patent: Jul. 22, 2003

(54) PACKAGE FOR SEMICONDUCTOR POWER DEVICE AND METHOD FOR ASSEMBLING THE SAME

(75) Inventors: Toshio Shimizu, Tokyo (JP); Hiroyuki Hiramoto, Tokyo (JP); Hiroki Sekiya, Tokoy (JP); Kenji Kigima, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/542,987

(22) Filed: Apr. 4, 2000

Related U.S. Application Data

(62) Division of application No. 09/207,141, filed on Dec. 8, 1998, now Pat. No. 6,201,696.

(30) Foreign Application Priority Data

| Dec. 8, 1997 | (JP) | ............................................. 9-337403 |
| Aug. 31, 1998 | (JP) | .......................................... 10-246334 |
| Sep. 10, 1998 | (JP) | .......................................... 10-256606 |

(51) Int. Cl.$^7$ ............................................. H01L 23/22
(52) U.S. Cl. ...................... 257/687; 257/706; 257/675; 257/788; 257/717
(58) Field of Search ................................ 257/687, 675, 257/706, 707, 712, 713, 788, 789, 790, 717; 438/111, 112, 122, 124, 126, 127

(56) References Cited

U.S. PATENT DOCUMENTS

| 4,814,943 A | * | 3/1989 | Okuaki ........................ 257/787 |
| 5,081,562 A | * | 1/1992 | Adachi et al. ............... 361/764 |
| 5,386,342 A | | 1/1995 | Rostoker .................... 361/749 |
| 5,398,160 A | | 3/1995 | Umeda ........................ 361/707 |
| 5,940,271 A | | 8/1999 | Mertol ........................ 361/704 |

FOREIGN PATENT DOCUMENTS

| EP | 0 661 748 | 7/1995 |
| EP | 0 727 818 | 8/1996 |
| EP | 0 789 397 | 8/1997 |

\* cited by examiner

Primary Examiner—Kevin M. Picardat
(74) Attorney, Agent, or Firm—Foley & Lardner

(57) ABSTRACT

A package for a semiconductor power device which comprises: a conductive bottom plate as a heat sink; an insulating substrate mounted on the bottom plate; a copper film formed on the insulating substrate to expose a peripheral region of the insulating substrate; semiconductor chips disposed on the copper film; a container arranged on the bottom plate, surrounding the insulating substrate; an external terminal supported through the container and connected electrically with the semiconductor chips; and a silicone gel filled within the container, wherein a solidified insulating material is disposed on an outer edge region of the copper film and the peripheral region of the insulating substrate. Thus, reducing an electric field across the interface and making it difficult to cause a creeping discharge. A notch is formed in the bottom plate, and the notch is filled with a high heat conductive resin. The notch is located outwardly apart from a region where the semiconductor chips are mounted. Thus, a creeping breakdown is prevented without sacrificing a heat radiation effect of the bottom plate. Using a waterproof and flexible film to seal an inlet for filling the silicone gel into the case, a heat stress caused by an expansion and a shrinkage of the silicone gel in response to a variation of temperatures is reduced, and it prevents the silicone gel from being wet. A thermoplastic insulating resin is employed instead of the silicone gel.

21 Claims, 19 Drawing Sheets

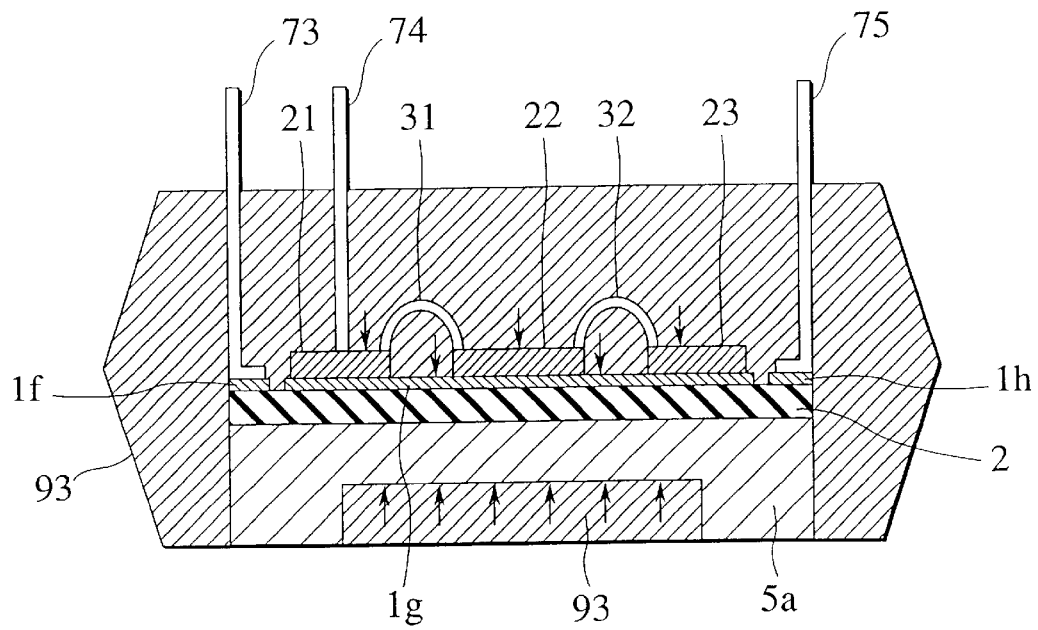
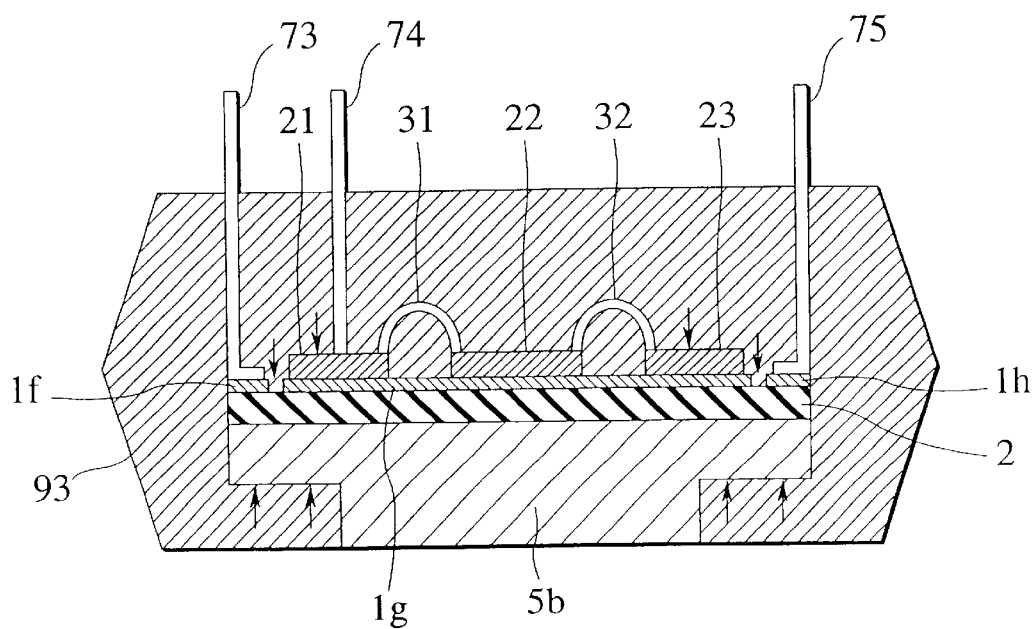

PACKAGE FOR SEMICONDUCTOR POWER DEVICE AND METHOD FOR ASSEMBLING THE SAME

This application is a divisional of application Ser. No. 09/207,141, filed Dec. 8, 1998, now U.S. Pat. No. 6,201,696.

BACKGROUND OF THE INVENTION

1. Field of the Invention

The present invention relates to a technology for increasing a breakdown voltage and reliability of a semiconductor power device, and more particularly to a packaging technology for preventing a dielectric breakdown of a power device module which has a plural of power switching devices mounted thereon and for increasing a breakdown voltage and reliability thereof.

2. Description of the Related Art

Semiconductor power devices for converting and controlling the flow of electric energy have been greatly researched and developed in recent years in response to high requirements from various fields including the power electronics field at first. It is particularly required to realize a power switching device, for example, a Power MOSFET, a Power Bipolar Transistor (Power BJT), a Gate Turn-off (GTO) Thyristor and an Insulated Gate Bipolar Transistor (IGBT) that can control a high power and achieve a high performance. As the result, a high voltage semiconductor power device called an Intelligent Power Module (IPM) is proposed and developed, which integrates a plural of power switching devices and a semiconductor chip that includes a circuit for controlling these devices in a single package. The IPM is currently applied to an inverter such as a direct drive circuit of an energy reduction type and an intelligent actuator, and is also expected to apply to other fields. In addition, it is particularly required to make the IPM have a much higher breakdown voltage.

To increase the breakdown voltage of such the semiconductor power device, it can be considered currently to improve a packaging technology that employs a substrate with a direct bond structure capable of achieving an advanced planning for heat radiation. The packaging technology that employs the substrate with the direct bond structure means such a packaging technology that employs a direct bond copper (DBC) substrate, which consists of a high heat conductive aluminum nitride (hereinafter, referred to as "an AlN") substrate and a copper film attached on the surfaces of the AlN substrate, and that can reduce a heat resistance and simplify the structure.

FIG. 1 is a cross sectional view showing a configuration of a package for a semiconductor power device with the DBC substrate. In the package, a plural of semiconductor chips 21, 22 and 23 are disposed on a copper film 1a that is attached on a top surface of an insulating AlN substrate 2 and another copper film 1b that is attached at a bottom surface of an insulating AlN substrate 2 except a peripheral region thereof. The semiconductor chips 21, 22 and 23 are connected electrically with each other via lead wires 31 and 32 such as bonding wires and ribbon wires. These semiconductor chips 21, 22 and 23 may, for example, include semiconductor power chips 21, 23 and a control circuitry chip 22 for controlling the semiconductor power chips 21 and 23.

The copper film 1b bonded to the bottom surface of the AlN substrate 2 is attached to the center of a metallic heat sink 5. A case (body of a container) 6 is equipped on a peripheral region of the heat sink 5 to surround the entire AlN substrate 2 as shown in FIG. 1.

A terminal holder 8 has external terminals (electrode terminals for external connection) 71, 72 and an aperture 8a, and is fixed at an upper portion inside the case (container body) 6 in order to close the outer case 6. The external terminals 71 and 72 are employed such members as to realize electrical conduction to external from each of the semiconductor power chips 21, 23 and the control circuitry chip 22 inside the case (container body) 6.

A silicone gel 91 or an insulating material is flowed through the aperture 8a into a module which is surrounded by the conductive bottom plate 5 used as the heat sink, the case (container body) 6 and the terminal holder 8. An epoxy resin is thereafter provided on the silicone gel to seal. After sealing with the epoxy resin, arranging the terminal holder 8 to close the case, which may consist of a material as same as or different from that of the outer case, then closing the aperture 8a with sealing materials 81 and 82 after setting the silicone gel 91.

In the particular case where the IPM is used in a high voltage power equipment, a hygroscopic property presented in the silicone gel 91 may degrade electric characteristics. Therefore, suitable adhering methods and adhering structures, which can suppress generation of openings and joints among the components by strong bonds between the outer case 6 and the heat sink (the conductive bottom plate) and between the lid (terminal holder) 8 and the epoxy resin, for example, are employed to prevent humidity from penetrating into the IPM as far as possible. An inner structure such as a space and a pressure-releasing valve is also provided inside the IPM to prevent the silicone gel 91 from swelling and exuding, and to reduce the heat stress applied to the epoxy resin.

The package structure shown in FIG. 1 may improve, by employing a high heat conductive AlN substrate, a thermal conductivity between the conductive bottom plate serving as the heat sink and the substrate, and may also reduce the amount of a molybdenum (Mo) plate and a solder material by bonding the semiconductor chip directly to the AlN substrate 2 that has the top copper film 1a. This is an advanced technology in the radiation planning which can reduce the heat resistance and simplify the structure as mentioned above.

However, the above-described conventional IPM has several technical problems that are derived from the structure thereof. These technical problems will be described below.

First, in order for undergoing to be used under a high voltage, the IPM adopts the adhering method or the adhering structure that can suppress the generation of the openings and joints between different components by the strong bonds. This configuration may play the role of reducing the moisture penetration. However, it is impossible to remove the generation of the openings and joints completely, leaving a tiny opening or joint within the semiconductor device. In addition, bonding the components strongly may increase the heat stress in a portion where different thermal expansion coefficients exist between components such as the outer case 6 and the heat sink (conductive bottom plate) 5, and may cause a breakage of the outer case 6 and an enlargement of the opening remained. The breakage of the outer case 6 and the enlargement of the opening may invite a moisture absorption by the silicone gel, resulting in a cause to degrade electrical properties and durability thereof.

Second, adding a component such as the pressure-releasing valve for relieving the heat stress inside the IPM may complicate an inner structure of the device and increase a size of the entire device.

Third, since the conventional IPM is produced from several materials such as the outer case 6, the lid (terminal holder) 8, the silicone gel 91 and the epoxy resin, the heat stress may be generated due to the differences among the thermal expansion coefficients of the materials, and a complicated force is applied to each portion inside the device, resulting in the breakage and the degradation of the substrate and electronic components in the device. In general, the steps that are required for assembling the device increases in accordance with the number of the materials used, causing a reduction of reliability of the product and an increase of cost.

Fourth, whereas the package structure of the conventional IPM has the advantage for planning the heat radiation to realize a high breakdown voltage, it leaves a problem with respect to the dielectric breakdown. Namely, the package structure mentioned above employs the silicone gel 91 as the insulating material, but the silicone gel 91 has a property in which a dielectric breakdown voltage is lower than those of general solid insulators. Because a creeping distance between the silicone gel 91 and the AlN substrate (a distance from an edge of the semiconductor power chip 21 or 23 to an edge of the AlN substrate 2) is short, a creeping breakdown at the interface between the both may occur. The adhesion at the interface between the both is insufficient, and a creeping discharge may occur easily.

Fifth, in the conventional semiconductor module, when the insulating substrate that receives the semiconductor chip is located directly on the bottom plate 5 of the metallic case (container body) that serves as the heat sink, the dielectric breakdown at the interface between the insulating substrate and the silicone gel may occur easily, because the creeping distance is short and the metallic bottom plate serves as a back electrode during the creeping discharge, extending the creeping discharge with ease.

Such the creeping breakdown and the creeping discharge do not occur when driven under a rated voltage, but considered to occur during driven under a higher voltage than the rated voltage. Once the creeping breakdown or discharge occurs, the dielectric breakdown voltage is lowered and the dielectric breakdown may be easily caused.

In view of increasing the breakdown voltage and improving the reliability, therefore, suppressing the creeping breakdown and discharge to prevent the dielectric breakdown is required.

SUMMARY OF THE INVENTION

The present invention is made in consideration of the above problems, and has an object to provide a package for a semiconductor power device with a high reliability.

Another object of the present invention is to provide a package for a semiconductor power device capable of preventing the dielectric breakdown, increasing the breakdown voltage and improving the reliability.

A different object of the present invention is to provide a package for a semiconductor power device capable of preventing damages to the module and operation defects in the semiconductor chip caused by the heat stress applied to the semiconductor chip and the containing case (container body) due to the thermal expansion and the thermal shrinkage of a filling agent.

A further object of the present invention is to provide a package for a semiconductor power device capable of providing a sufficient waterproof effect to the semiconductor module.

A further different object of the present invention is to provide a package for a semiconductor power device having an advanced electric property and a high durability.

A further object of the present invention is to provide a method for assembling a package for a semiconductor power device having an advanced electric property and a high durability.

An essential point of a first and a second features of the present invention is to realize a higher breakdown voltage of the package for the semiconductor power device, which is achieved with a configuration that can suppress the creeping breakdown and the creeping discharge at an interface of two kinds of insulating materials or the DBC substrate and the silicone gel.

In order to suppress the creeping breakdown and the creeping discharge at the interface of the two kinds of insulating materials, a system for increasing the breakdown voltage by interposing an insulating resin such as an epoxy resin and a polyester resin which has a dielectric breakdown voltage higher than those of both the insulating materials therebetween (the first feature), and a system for relieving the electric field across the interface between the insulating materials (the first and second features) are considered.

(a) The system for increasing the breakdown voltage according to the first feature may also relax the electric field strength. Moreover, it is particularly preferable to interpose a thicker insulator by heaping or adhering a solid in view of suppressing a penetrative puncture.

(b) The system for relieving the electric field according to the first and second features includes a material type which interposes an insulator having a median permittivity of those of both the insulators therebetween, and an engineering type which eliminates any sharp shapes such as corners and rough surfaces that cause the creeping discharge at the interface between both the insulating materials with ease.

(b-1) The following ways are available as the material type:
a way for coating a resin such as the epoxy and polyester between both the insulating substrates; and a way for further filling into the resin a powdered ceramic such as an aluminum oxide (hereinafter, referred to as "$Al_2O_3$") and the AlN.

(b-2) The following ways are considered as the engineering type: a way for contacting the copper film tightly with the AlN substrate by covering all the edges and corners of the film with the resin; and a way for polishing to smooth the surface of the outer edge region of the DBC substrate.

On the basis of the above novel knowledge found experimentally by the present inventors, the first feature of the present invention lies in a package for a semiconductor power device which comprises at least: a conductive bottom plate serving as a heat sink; an insulating substrate mounted on the bottom plate; a conductive film formed on the insulating substrate selectively to expose a peripheral region of the insulating substrate and a semiconductor chip mounted on the conductive film; a solidified insulating material disposed on an outer edge region of the conductive film and the peripheral region of the insulating substrate; and an insulating material formed on the semiconductor chip. "The solidified insulating material" may, for example, a hardened resin.

According to the first feature of the present invention, the solidified insulating material disposed on the outer edge region of the conductive film and the peripheral region of the insulating substrate may contact the outer edge region of the conductive film with the peripheral region of the insulating substrate tightly. Further, the solidified insulating material interposed into an interface between the both—the conductive film and the peripheral region of the insulating substrate—may relax an electric field strength across the interface between the both and make it difficult to cause the creeping discharge. As a result, the prevention of the dielectric breakdown, the realization of a higher breakdown voltage of the semiconductor power device and the improvement of the reliability can be achieved. If a height of the solidified insulating material exceeds a thickness of the semiconductor chip, the thick the solidified insulating material can suppress a penetrative puncture in which the discharge punches through the solidified insulating material from the outer edge region of the conductive film, and can prevent the creeping breakdown completely. Containing the powdered aluminum oxide in the solidified insulating material may further relax the electric field strength and make it difficult to cause the creeping breakdown.

In the first feature of the present invention, it is possible to further comprise a container arranged on the bottom plate, surrounding the insulating substrate; an upper lid arranged at an upper portion of the container; an external terminal supported through the upper lid and connected electrically with the semiconductor chip. Then the insulating material can be filled within the container to cover the semiconductor chip.

The second feature of the present invention lies in a package for a semiconductor power device which comprises at least: a conductive bottom plate serving as a heat sink; an insulating substrate mounted on the bottom plate, having a smooth region of a given surface roughness near a peripheral region thereof; a conductive film formed selectively on the insulating substrate, and a semiconductor chip mounted on the conductive film; and an insulating material formed on the semiconductor chip.

According to the second feature of the present invention, an exposed top surface at the peripheral region of the insulating substrate or a bottom surface opposing to the top surface, that is, a plane mating to the conductive bottom plate serving as the heat radiating plane has the smooth region of the given surface roughness, which may not cause a partial discharge from the surface at the peripheral region of the insulating substrate. Thus, the prevention of the dielectric breakdown, the realization of a higher breakdown voltage of the semiconductor power device and the improvement of the reliability can be achieved.

The "given surface roughness" means a certain flatness realized by polishing. For example, a surface roughness smaller than 0.05 $\mu$m, which is at least one order smaller than the conventional roughness of the insulating substrate may be preferable. A method for polishing to achieve the "smooth region having the given surface roughness" is based practically on the following experiments performed by the present inventors:

When causing the dielectric breakdown in the simple AlN by means of a ball-plane electrode pair in an insulating liquid or a perfluorocarbon (dielectric constant: 1.86), a breakdown position is located at a portion slightly apart from a contacting portion with the ball;

When causing the dielectric breakdown at the AlN substrate in the perfluorocarbon, a breakdown position is located at the edge of the copper film, and a value of the dielectric breakdown voltage increases by about 10%;

On the other hand, when causing the dielectric breakdown at the AlN substrate in the silicone gel (dielectric constant: about 2.8), a breakdown position is located at a portion apart from the edge of the copper film, and the value of the dielectric breakdown voltage further increases by about 10%;

The dielectric breakdown in the perfluorocarbon left partial discharge scars around the electrodes uniformly, while the dielectric breakdown in the silicone gel left tree-like discharge scars locally; and When causing the dielectric breakdown in the silicone gel after polishing the surface of the AlN substrate outside the edge of the copper film to the given surface roughness by 3 $\mu$m has further increased the value of the dielectric breakdown voltage by about 10% or more.

These results are observed similarly in insulating substrates other than the AlN substrate, for example, an alumina ($Al_2O_3$) substrate and a beryllia ($BeO_2$) substrate. The present inventors therefore conclude that the number (area) of the partial discharge scars has a relationship proportional to the value of the dielectric breakdown voltage, and that the smoothness of the surface has a relationship proportional to the value of the dielectric breakdown voltage. As the partial discharge may take place due to the irregularity of the surface, and as the dielectric breakdown may occur due to the partial discharge in the AlN substrate, the upper or bottom surface of the peripheral region of the insulating substrate should be completed so as to have the given surface roughness.

A solidified insulating material, or a hardened resin as similar as that of the first feature may be applied on the smooth region of the insulating substrate. Thus, the prevention of the dielectric breakdown, the realization of the higher breakdown voltage of the semiconductor power device and the improvement of the reliability can be achieved.

Similar to the first feature, in the second feature of the present invention, it is possible to further comprises a container arranged on the bottom plate, surrounding the insulating substrate; an upper lid arranged at an upper portion of the container; an external terminal supported through the upper lid and connected electrically with the semiconductor chip. Then the insulating material can be filled within the container to cover the semiconductor chip.

The third feature of the present invention lies in a package for a semiconductor power device which comprises at least: a conductive bottom plate serving as a heat sink, wherein the bottom plate has a notch arranged in a peripheral region of a surface thereof; an insulating substrate mounted on the bottom plate; a conductive film formed on the insulating substrate selectively to expose a peripheral region of the insulating substrate and a semiconductor chip mounted on the conductive film; and an insulating material formed on the semiconductor chip.

According to the third feature of the present invention, a creeping distance for a creeping current that is generated when flowing from the semiconductor chip through the insulating substrate may be substantially elongated, and the creeping breakdown voltage of the semiconductor power device may be increased. The notch is preferably located outwardly apart from a region for mounting the semiconductor chip. Thus, as the insulating substrate below the region for mounting the semiconductor chip can contact tightly at least with the heat sink, the thermal radiation effect of the semiconductor chip can be maintained. If an insulating material with a high thermal conductivity is buried within the notch, the notch serves as an insulator. Therefore, the creeping breakdown voltage of the semiconductor device can be further increased certainly, and the radiation of the heat from the insulating substrate can be performed sufficiently.

Similar to the first and second features, it is possible to further comprises a container arranged on the bottom plate, surrounding the insulating substrate; an upper lid arranged at an upper portion of the container; an external terminal supported through the upper lid and connected electrically with the semiconductor chip. Then the insulating material can be filled within the container to cover the semiconductor chip.

The fourth feature of the present invention lies in a package for a semiconductor power device which comprises at least: a conductive bottom plate serving as a heat sink; an insulating substrate mounted on the bottom plate; a conductive film formed on the insulating substrate selectively to expose a peripheral region of the insulating substrate and a semiconductor chip mounted on the conductive film; a container arranged on the bottom plate, surrounding the insulating substrate; an upper lid arranged at an upper portion of the container; an inlet formed at a part of the upper lid; an insulating material injected through the inlet to fill the container; and a waterproof and flexible film located at and to close the inlet.

According to the fourth feature of the present invention, even if the thermal expansion and shrinkage of the insulating material due to the variation of temperature occur, the heat stress can be relaxed because of a deformation of the flexible film which closes the inlet for injecting insulating material. A metallic film may be employed as the film. A multi-layer film which consists of stacked waterproof films and metallic films may also be utilized. A multi-layer structure which has a film in at least one layer capable of adhering to a film-fixing plane around the inlet for insulating material with an adhesion higher than those of the other stacked films may be applied to the flexible film to ensure tight contacts among the films. A laminated film which has a waterproof film in at least one layer and another film with a greater resistance against the heat stress compared to that of the waterproof film in at least another layer may also be used as the flexible film.

The fifth feature of the present invention lies in a package for a semiconductor power device which comprises at least: a conductive bottom plate serving as a heat sink; an insulating substrate mounted on the bottom plate; a conductive film formed on the insulating substrate selectively to expose a peripheral region of the insulating substrate and a semiconductor chip mounted on the conductive film; an insulating material formed on the semiconductor chip; and a foam provided on the insulating material.

According to the fifth feature of the present invention, as the foam which is filled on the insulating material can serve as a buffer against the thermal expansion and shrinkage of the insulating material such as the silicone gel, the heat stress applied to the package for the semiconductor power device may be relaxed.

Similar to the first to third features, it is possible to further comprises a container arranged on the bottom plate. Then the insulating material can be filled within the container up to a middle height; and the foam is provided on the insulating material.

The sixth feature of the present invention lies in a package for a semiconductor power device which comprises at least: a conductive bottom plate serving as a heat sink; an insulating substrate mounted on the bottom plate; a conductive film formed on the insulating substrate selectively to expose a peripheral region of the insulating substrate and a semiconductor chip mounted on the conductive film; a container arranged on the bottom plate, surrounding the insulating substrate; a jog portion formed on a side of an upper aperture of the container; a sealing material provided in the aperture, having another jog portion corresponding to the jog portion of the aperture; and an insulating material formed on the semiconductor chip to fill the container.

According to the sixth feature of the present invention, presence of the jog portion formed on the upper part of the container may elongate a distance at an adhered interface between the container and the sealing material. The adhered interface may substantially reduce an amount of moisture that penetrates into the container through the interface, because the amount is inversely proportional to the second power of the distance.

The seventh feature of the present invention lies in a package for a semiconductor power device which comprises at least: a conductive bottom plate serving as a heat sink; an insulating substrate mounted on the bottom plate; a conductive film formed on the insulating substrate selectively to expose a peripheral region of the insulating substrate, for mounting semiconductor chip on the conductive film; a container arranged on the bottom plate, surrounding the insulating substrate; an insulating material formed on the semiconductor chip to fill the container; an upper lid arranged at an upper portion of the container; an external terminal supported through the upper lid and connected electrically with the semiconductor chip; and an insulating sheath for covering an outer surface of the external terminal.

According to the seventh feature of the present invention, even in a structure where the external terminal passes through a material with a relatively lower dielectric breakdown voltage such as the foam, the dielectric breakdown voltage can be increased. The insulating sheath which covers the external terminal passes through the upper lid and the insulating material. The insulating sheath may, for example, be made of resin. Therefore, if the dielectric constant of the sheath is lower than those of the upper lid and the insulating material, an electric field near the external terminal becomes greater than that when the external terminal is not covered with the insulating sheath. Thus, a material which has a dielectric constant higher than that of the upper lid is required as the insulating sheath for covering. It is also required, of course, that the dielectric constant of the insulating sheath for covering is higher than that of the insulating material. Thus, the dielectric breakdown voltage between the external terminals can be increased and the generation of the dielectric breakdown can be prevented.

The eighth feature of the present invention lies in a package for a semiconductor power device which comprises at least: a conductive bottom plate serving as a heat sink; an insulating substrate mounted on the bottom plate; a conductive film formed on the insulating substrate selectively to expose a peripheral region of the insulating substrate and a semiconductor chip mounted on the conductive film; a thermoplastic insulating resin formed on the semiconductor chip; and an external terminal arranged through the thermoplastic insulating resin and connected electrically with the semiconductor chip.

According to the eighth feature of the present invention, as the entire semiconductor chip is covered with the thermoplastic resin that has a high waterproof property, the degradation of the semiconductor power device due to the absorption of humidity can be prevented, and advanced electric properties can be obtained. Further, an inner structure can be simplified compared to the conventional one, the package for the semiconductor power device can be miniaturized, and the steps required to assemble the semiconductor power device can be reduced.

In the eighth feature of the present invention, the thermoplastic insulating resin can seal the insulating substrate, the semiconductor chip and at least a part of the bottom plate integrally. However, it is also possible to implement a configuration, in which the thermoplastic resin is molded only on the insulating substrate so as not to contact with the bottom plate. By molding the thermoplastic resin only on the insulating substrate without contacting to the bottom plate, a thickness of molding and an amount of the thermoplastic resin used can be reduced. Further, as the molding can be easily performed and the assembling time can be shortened, the problems during molding such as the deformation of the components which are employed to construct the device can be reduced, and the durability and reliability of the package for the semiconductor power device can be improved.

The ninth feature of the present invention lies in a method for assembling a package for a semiconductor power device which comprises at least the steps of: (a) bonding an insulating substrate on a conductive bottom plate; (b) mounting a semiconductor chip on the insulating substrate; (c) connecting electrically the semiconductor chip with an external terminal; (d) injection-molding an insulating resin on the bottom plate to form an outer case consisting of the insulating resin for surrounding the insulating substrate and the semiconductor chip; and (e) filling a insulating resin within the outer case.

According to the ninth feature of the present invention, the outer case is produced by injecting the insulating resin onto the metallic base, so the outer case and the metallic base are firmly integrated. In addition, the adhesion between the outer case and the metallic base is improved, and the moisture penetration into the device can be prevented. The insulating resin may be a thermoplastic insulating resin or another resin.

A polyphenylene sulfide may be used as the thermoplastic resin in the eighth and ninth features. Catalysts, additives and inorganic fillers may also be employed suitably to adjust the adhesion and to relax the inner stress with using the polyphenylene sulfide as a main constituent. Preferable examples of the inorganic fillers may include a fused silica, a powdered quartz, a powdered glass, a short glass fiber, an alumina ($Al_2O_3$) and an aluminum nitride (AlN). In the case where the thermoplastic resin has a two-layer structure, a sandwich-molding may be applied to mold the resin. A vacuum pressure impregnation treatment may also be employed preferably for impregnating the insulating resin into the insulating substrate in advance to improve an insulating property of the insulating substrate by repairing the inner defects of the insulating substrate. A laminated structure that consists of plural insulating substrate materials may be applied to the insulating substrate to improve the insulating property of the insulating substrate.

The "semiconductor power devices" in the first through ninth features may include various power devices such as the IGBT, the Power MOSFET, the Power BJT, a Power Static Induction Transistor (SIT), a Thyristor, the GTO Thyristor and a Static Induction (SI) Thyristor. The "semiconductor chips" means such semiconductor chips that have at least one of the semiconductor power devices mounted thereon. These semiconductor chips may also include a chip which has a circuit for controlling the semiconductor power device and a protection circuit mounted thereon. A power IC that integrates the control circuit on the same monolithic substrate where the semiconductor power device is formed may also be employed. At least one of these "semiconductor chips" may be disposed on the conductive film. The package for semiconductor power device according to the present invention can include various electronic components, for example, resistors, capacitors, inductors, circuit wires and leads such as bonding wires.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 13A is a longitudinal cross sectional view showing a package structure for a semiconductor power device according to a modification (MODIFICATION 1) of the eighth embodiment of the present invention;

FIG. 13B is a longitudinal cross sectional view showing a package structure for a semiconductor power device according to another modification (MODIFICATION 2) of the eighth embodiment of the present invention;

DETAILED DESCRIPTION OF THE PREFERRED EMBODIMENTS

Figure 1:
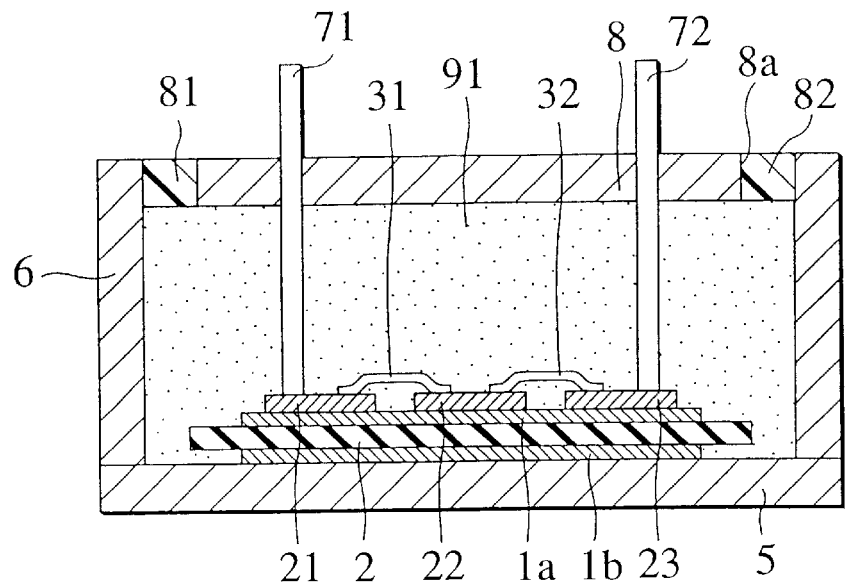
FIG. 1 is a cross sectional view showing a conventional package structure for a semiconductor power device.

Various embodiments of the present invention will be described with reference to the accompanied drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.
(First Embodiment)

Figure 2A:
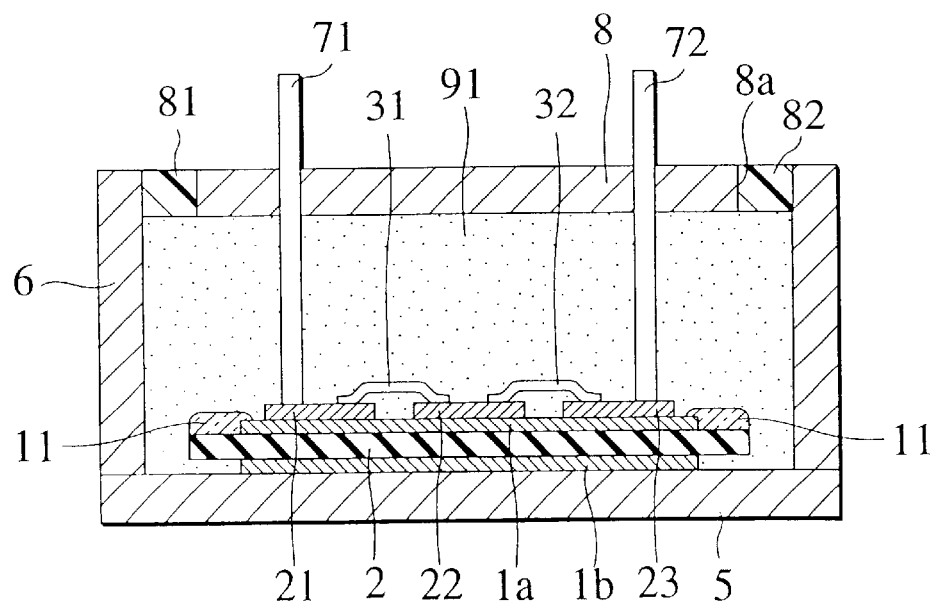
FIGS. 2A and 2B are cross sectional views showing a package structure for a semiconductor power device according to a first embodiment of the present invention.

FIG. 2A is a cross sectional view showing a structure of a package for a semiconductor power device according to a first embodiment of the present invention. The first embodiment of the present invention intends to improve the reliability by preventing the creeping breakdown and the creeping discharge between an insulating substrate (ceramic substrate) 2 and an adjacent silicone gel 91. Whereas an aluminum nitride (AlN), an alumina ($Al_2O_3$), and a beryllium oxide such as a beryllia ($BeO_2$) can be used as the insulating substrate (ceramic substrate) 2, the following description will be made with respect to an AlN substrate. In a practical use, the AlN substrate 2 is provided with a top copper film 1a and a bottom copper film 1b both attached on a top surface and under a bottom surface of the AlN substrate 2, respectively, except peripheral regions thereof by the direct bond copper (DBC) technique. The top copper film 1a on the AlN substrate 2 is constructed in the form of a certain inner pattern. On such the top copper film 1a, semiconductor power chips 21, 23 and a control circuitry chip 22 merging control circuitry to control them are disposed.

The insulating substrate 2 on which the semiconductor chips 21, 22 and 23 are mounted is contained in a case 6 (container body). A bottom plate of the case 6 (container body) to which the bottom copper film 1b is attached is made of a metal to serve as a heat sink 5. Bonding wires 31 and 32 are connected with the semiconductor power chips 21 and 23 on the insulating substrate, from which external terminals (lead wires) 71 and 72 are drawn out from the case (container body) in order to make electrical connections with outside a module. The external terminals 71 and 72 are used for supplying power to the semiconductor power chips 21, 23 and the control circuitry chip 22. The silicone gel 91 or an insulating material is filled within the case 6 (container body) to protect the connecting leads 31 and 32. A top surface of the case 6 (container body) is provided with a terminal holder 8 or an upper lid. An inlet for injecting the insulating material (an inlet for injecting the silicone gel) is generally sealed with resinous sealing materials 81 and 82. The entire semiconductor device has, for example, an outer size of about 100 mm×70 mm×10 mm.

Various power devices such as IGBTs, power MOSFETs, power BJTs, power SITs, thyristors, GTO thyristors or SI thyristors can be used as the semiconductor power chips 21 and 23. An n-MOS control circuit, a p-MOS control circuit, a CMOS control circuit, a bipolar control circuit, a Bi-CMOS control circuit and a SIT control circuit can be used as the control circuitry. These control circuits may contain an overvoltage protection circuit, an overcurrent protection circuit and an overheat protection circuit. The semiconductor power chips 21, 23 and the control circuitry chip 22 are electrically connected with each other through the connecting leads 31 and 32. Bonding wires or bonding strips made of gold (Au), copper (Cu), aluminum (Al) and the like may be used as the connecting leads 31 and 32. Besides the semiconductor power chips 21, 23 and the control circuitry chip 22, various electronic components such as resistors, condensers, coils and the like, and also a circuit such as a power supply can be provided in the package of the semiconductor power device according to the first embodiment of the present invention.

As shown in FIG. 2A, an upper portion of the peripheral region of the AlN substrate 2 and an edge portion (outer edge region) of the copper film facing thereto are coated with a solidified insulating material, or a hardened resin 11. Resins which have a breakdown voltage higher than that of the silicone gel 91 and a good adhesion to the AlN substrate 2 are desirable for the solidified insulating material 11. For example, an epoxy resin is used herein as the solidified insulating material 11. A polyester resin may also be used as the solidified insulating material 11.

Figure 2B:
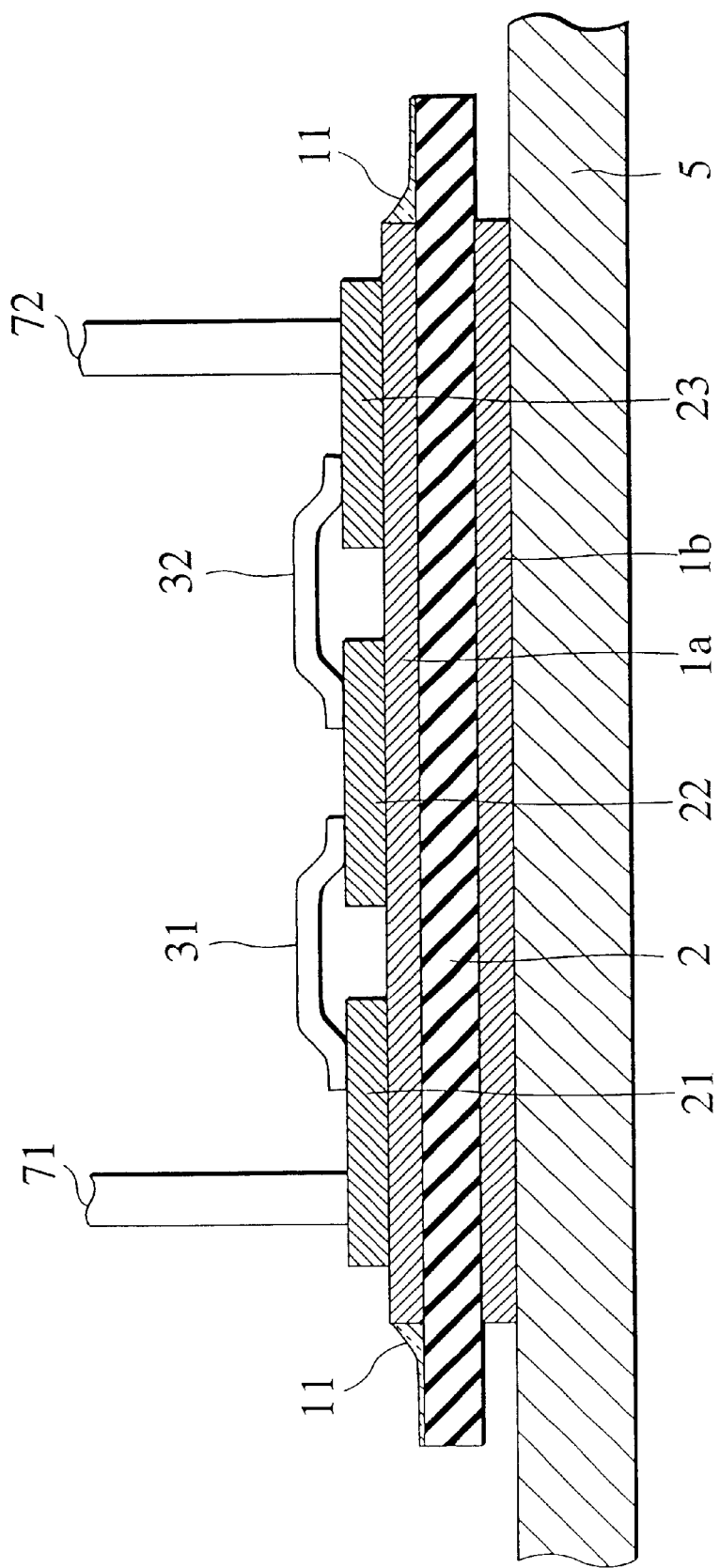

A thickness of the solidified insulating material 11 relates to a creeping distance from the semiconductor power chips 21 and 23 to the edge of the AlN substrate 2. A long creeping distance may effect to prevent the breakdown even if the resin is thin. In FIG. 2A, the shoulder of the outer edge of the top copper film 1a is fully coated with the solidified insulating material 11, but the shoulder of the top copper film 1a is not always needed to be fully coated with the solidified insulating material 11. However the effectiveness of the first embodiment of the present invention to suppress the creeping discharge is accomplished to some extent in the case that the corner part formed between the edge wall of the top copper film 1a and the AlN substrate 2 is buried with the resin 11 as shown in FIG. 2B. By the configuration as shown in FIG. 2B, in which the shoulder of the outer edge of the top copper film 1a is exposed, the amount of resin 11 employed is saved, and results in reducing the manufacturing cost of the package. If the creeping distance is substantially the same as the thickness of the AlN substrate 2, a further improvement of the preventing effect is obtained by a structure which piles up the resin 11.

It is preferable that the solidified insulating material 11 is not be coated on the conductive bottom plate 5 that serves as the heat sink. If the solidified insulating material (the resin) 11 is coated and fixed on the conductive bottom plate 5 that serves as the heat sink, there may be introduced a counter result that causes peeling off of the resin 11 by heat cycles due to a mismatching in thermal expansion coefficients of the AlN substrate vs. the conductive bottom plate 5, and resulting in the creeping breakdown with ease.

As mentioned above, the outer edge region of the top copper film 1a and the peripheral region of the AlN substrate 2 are adhered tightly because the solidified resin 11 is provided on the outer edge region of the top copper film 1a and the periphery region of the AlN substrate 2. Further, existence of the resin 11 at an interface between the outer edge region of the top copper film 1a and the peripheral region of the AlN substrate 2 can relax an electric field strength at the interface between the both, and can prevent the creeping discharge. Therefore, the prevention of the dielectric breakdown, the improvement of the reliability and the increase of the breakdown voltage can be realized. The solidified resin 11 provided on the outer edge region of the top copper film 1a and the peripheral region of the AlN substrate 2 may act as a reinforcement member. Hence, a miniaturization of the DBC substrate can be expected because of the improvement of the reliability in the junction between the top copper film 1a and the AlN substrate 2 along with the improvement of the mechanical strength of the AlN substrate 2.

Modification of First Embodiment

Figure 3A:
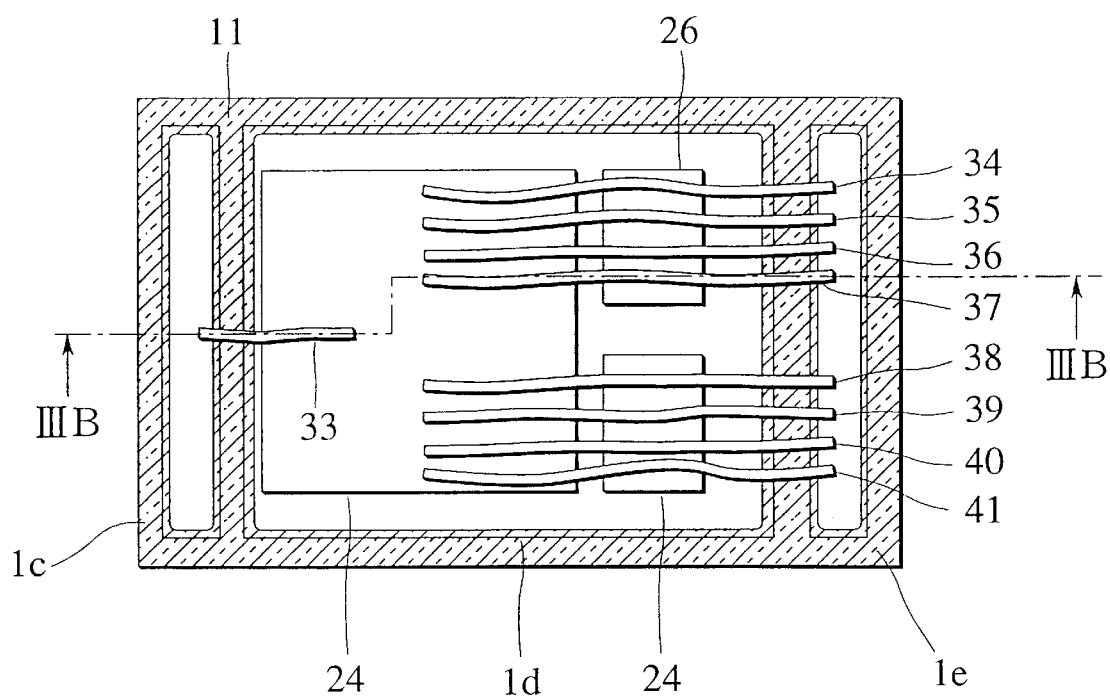
FIG. 3A is a plan view showing still another package structure for a semiconductor power device according to a modification (MODIFICATION 1) of the first embodiment of the present invention.
Figure 3B:
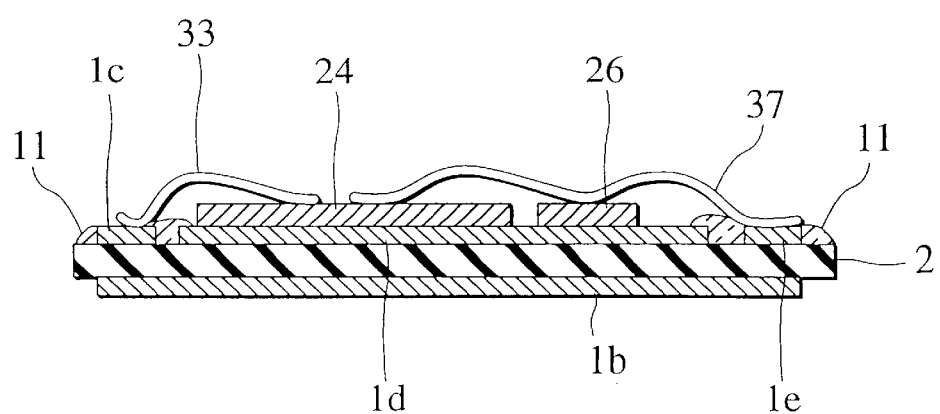
FIG. 3B is a step cross sectional view taken along the line III B—III B of FIG. 3A.

MODIFICATION 1: In FIG. 2A, only the peripheral of the entire outer edge region of the top copper film 1a is coated with the solidified insulating material 11, not only the edges facing to the peripheral region of the AlN substrate 2, but also other edges of wiring patterns 1c, 1d and 1e consisting of the top copper film, for example, may also be coated with the solidified insulating material 11 as shown in FIGS. 3A and 3B. FIG. 3A is a plan view showing a package structure for a semiconductor power device according to a modification (MODIFICATION 1) of the first embodiment of the present invention, and FIG. 3B is a step cross sectional view taken along the line III B—III B of FIG. 3A. As shown in FIG. 3B, the DBC substrate is provided with top copper films 1c, 1d and 1e and a bottom copper film 1b both attached on a top surface and under a bottom surface of the AlN substrate 2, respectively, except peripheral regions. The top copper film on the AlN substrate 2 is delineated into three inner patterns 1c, 1d and 1e. On such the top copper film 1d, semiconductor power device (IGBT)chips 24, and two diode chips 25 and 26 are disposed. The inner patterns 1c and 1e are serving as electrode terminals. The upper part of the inner patterns 1e and IGBT chip 24 are electrically connected by bonding wires 34, 35, 36 and 37. And the lower part of the inner patterns 1e and IGBT chip 24 are electrically connected by bonding wires 38, 39, 40 and 41.

Further, the inner patterns 1c and IGBT chip 24 are electrically connected by a bonding wire 33. As shown in FIGS. 3A and 3B, by coating and coagulating with the resin 11 which have a breakdown voltage higher than that of the silicone gel the dielectric breakdown is further suppressed. A configuration to coat and solidify only corners of the top copper film, that is generally square shape, with the resin, may suppress the dielectric breakdown in some extent.

Figure 4A:
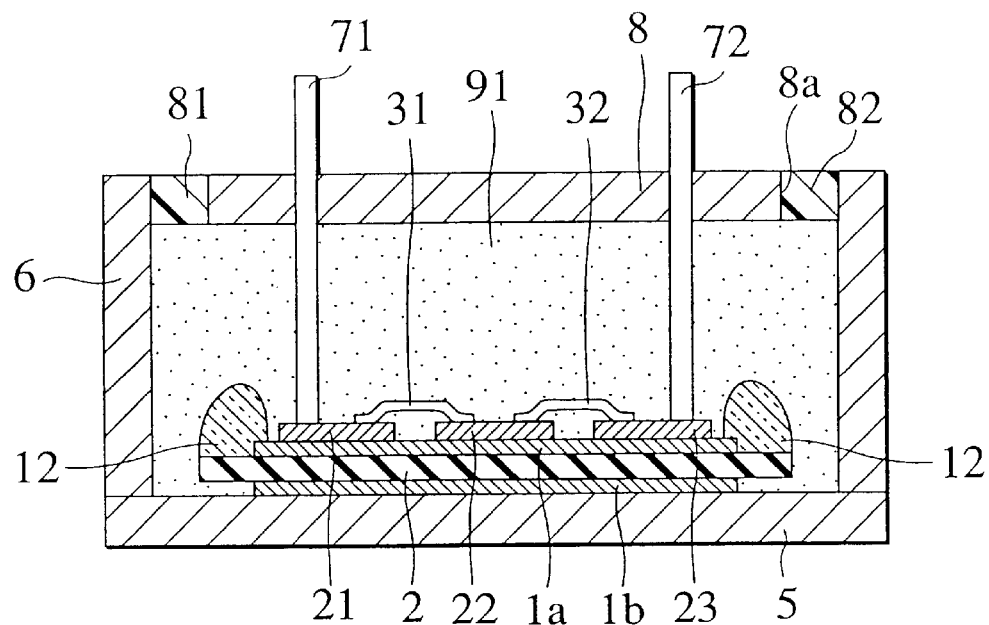
FIG. 4A is a cross sectional view showing a still another package structure for a semiconductor power device according to another modification (MODIFICATION 2) of the first embodiment of the present invention.

MODIFICATION 2: If the creeping breakdown voltage at the interface between the AlN substrate 2 and the solidified insulating material 11 increases in the structure shown in FIG. 4A, the solidified insulating material 11 may undergo a penetrative puncture at the peripheral region of the top copper film 1a, and the creeping discharge may develop at the interface between the solidified insulating material 11 and the silicone gel 91. The present modification (MODIFICATION 2) intends to suppress the penetrative puncture in which the discharge punches through the solidified insulating material 11 at the outer edge region of the copper film. In particular, a thick solidified insulating material 12, or a thick resin 12 heaped up to a height that exceeds at least a thickness of the semiconductor chip is used as shown in FIG. 4A instead of the solidified insulating material (the resin) 11. According to the structure shown in FIG. 4A, the thick resin 12 prevent the penetrative puncture which punches through the resin 12 at the outer edge region of the top copper film 1a, the creeping breakdown can be prevented completely, in addition to the effectiveness described with reference to FIG. 4A.

Figure 4B:
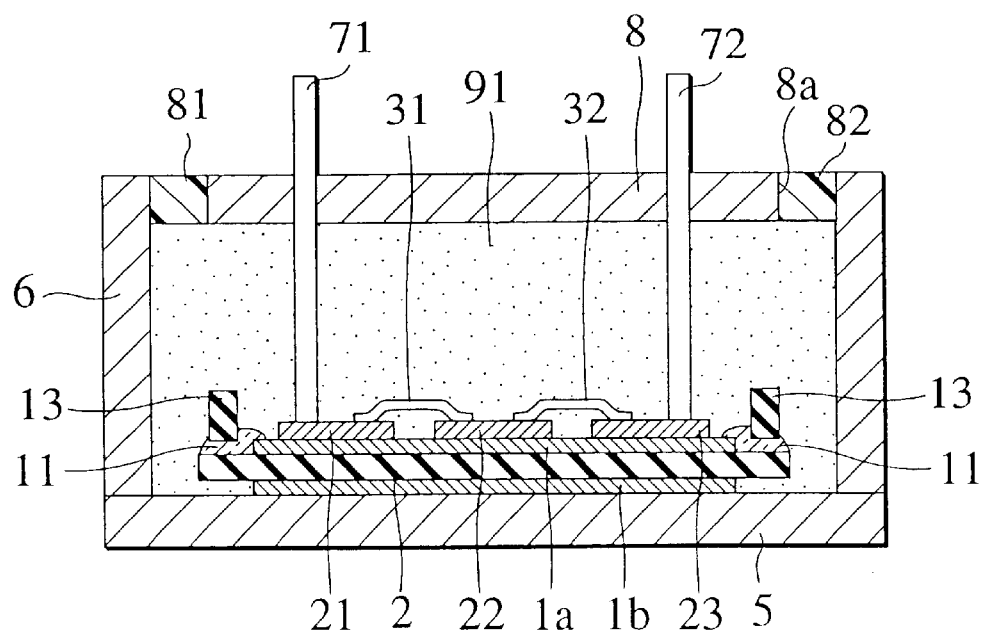
FIG. 4B is a cross sectional view showing a still another package structure for a semiconductor power device according to still another modification (MODIFICATION 3) of the first embodiment of the present invention.

MODIFICATION 3: The epoxy resin 12 has a variety of viscosity. Among those, the one with a lower viscosity makes it difficult to form the heaped portion in the MODIFICATION 2 shown in FIG. 4A. A still another modification (MODIFICATION 3) of the first embodiment of the present invention intends to propose a structure which may form the heaped portion easily. In the MODIFICATION 3, a heaped member 13 that is included and mounted with the resin 11 is provided as shown in FIG. 4B. According to such the configuration, as the heaped member 13 may be formed in advance and thereafter it may be adhered with the resin 11 to form a heaped shape easily, the solidified insulating material can be formed in a thick shape easily, in addition to the effectiveness of the MODIFICATION 2. The heaped member 13 may also be produced from an AlN, the same material as that of the AlN substrate 2 instead of the resin. In the case where the heaped member 13 consists of the AlN, in addition to the effectiveness of the present embodiment, the reduction of the electric field at the edges of the top copper film 1a and the increase of the dielectric breakdown voltage may be realized. Thus, the prevention of the dielectric breakdown, the realization of the high breakdown voltage and the improvement of the reliability can be achieved.

OTHER MODIFICATIONS: In the first embodiment, the solidified insulating material, or the hardened epoxy resin can be disposed on the edges of the semiconductor power chips 21 and 23 in the structures shown in FIGS. 2A–4B to further relax the electric field strength. The epoxy resin has a dielectric constant ranging between 3.5–5.0, and has an intermediate value between the dielectric constant of the AlN, about 8.8, and that of the silicone gel 91, about 2.8. Therefore, coating the epoxy resin that has the intermediate dielectric constant between those of the AlN substrate 2 and the silicone gel 91 may relax the electric field strength at the edge of the top copper film 1a. A powdered $Al_2O_3$ may also be contained in the resins 11–13 shown in FIGS. 2A–4B in order to further relax the electric field strength. The $Al_2O_3$ has a dielectric constant of about 8.3. Therefore, filling the powdered $Al_2O_3$ into the heaped member 13, which is made of a resin, or the resins 11 and 12 may further relax the electric field strength and make it difficult to cause the creeping discharge. A powdered AlN may be filled instead of the $Al_2O_3$. The powdered $Al_2O_3$ and AlN may also be filled together.

(Second Embodiment)

Figure 5:
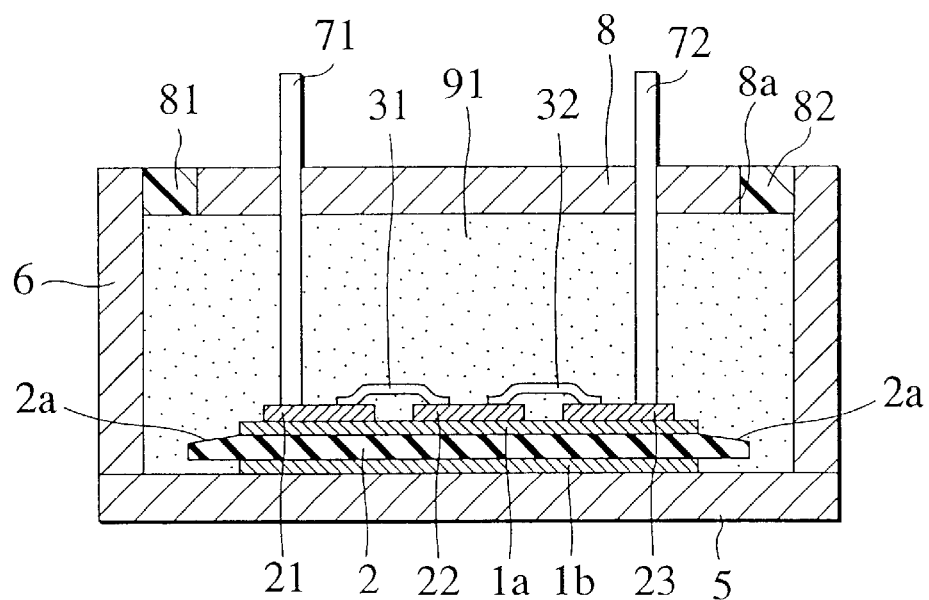
FIG. 5 is a cross sectional view showing a package structure for a semiconductor power device according to a second embodiment of the present invention.

FIG. 5 is a cross sectional view showing a structure of a package for a semiconductor power device according to a second embodiment of the present invention. The second embodiment of the present invention intends of prevent the creeping breakdown and the creeping discharge in a manner different from the first embodiment.

The package for a semiconductor power device according to the second embodiment of the present invention employs an AlN substrate 2 that includes a top copper film 1a and a bottom copper film 1b disposed on a top and under a bottom surfaces of the AlN substrate 2, respectively, except the peripheral region by the DBC technique as same as the first embodiment. The top copper film 1a on the AlN substrate 2 is delineated and constructed in the form of a given inner pattern. The semiconductor power chips 21, 23 and the control circuitry chip 22 merging control circuitry for controlling these semiconductor power chips are mounted on the top copper film 1a.

Various power devices such as IGBTs, Power MOSFETs and Power BJTs may be used as the semiconductor power chips 21 and 23. Various control circuits such as a CMOS control circuit, Bipolar control circuit and BiCMOS can be employed as the control circuit. These control circuits may contain an overvoltage protection circuit, an overcurrent protection circuit and an overheat protection circuit. The semiconductor power chips 21 and 23 are connected electrically with the control circuitry chip 22 to each other via bonding wires 31 and 32.

The insulating substrate 2 that mounts the semiconductor chips 21, 22 and 23 thereon is accommodated within a case 6 (container body). The bottom plate, to which the bottom copper film 1b is attached, of the case (container body) 6 serves as a heat sink 5 made of a metal. External terminals (lead wires) 71 and 72 are drawn out of the case (container body) for making electrical connections with the external of the module from the semiconductor power chips 21 and 23 on the insulating substrate which are connected to control circuitry chip 22 through the bonding wires 31 and 32. The external terminals 71 and 72 are such terminals that supply power to the semiconductor power chips 21, 23 and control circuitry chip 22. A silicone gel 91 is filed within the case (container body) 6 to protect the bonding wires 31 and 32. A top surface of the case (container body) 6 is covered with a terminal holder 8. An inlet for injecting the silicone gel is generally sealed with resinous sealing materials 81 and 82. Various electronic components such as condensers and coils may be mounted on the AlN substrate.

The package for semiconductor power device according to the second embodiment of the present invention adopts such a structure that an exposed top surface of the peripheral region in the AlN substrate 2 is polished to make a smooth region 2a having a given surface roughness. In general, the surface roughness of the insulating substrate employed in the package for the semiconductor power device is 0.4–0.6 $\mu$m. However, the given surface roughness of the smooth region 2a of the AlN substrate 2 in the second embodiment is smaller than 0.05 $\mu$m, which is at least one order smaller than the conventional roughness of the insulating substrate. And it is preferable to polish the smooth region 2a to obtain a mirror like surface. If we use a SiC abrasive paper of #1000 mesh, it is easy to obtain the given surface roughness at the smooth region 2a of the AlN substrate 2 in the second embodiment. The mirror like polished finish is obtained by buffing.

Here, the smooth region 2a of the AlN substrate 2 is located outwardly apart from the edge of the top copper film 1a. The polishing is performed so as not to generate any gaps between the top copper film 1a and the AlN substrate 2. Polishing the substrate over the top copper film 1a may realize a greater effect if the top copper film 1a is still firmly attached to the AlN substrate 2 without gaps.

According to the above configuration, the exposed surface of the peripheral region of the AlN substrate 1 consists of the smooth region 2a that is polished and has no surface roughness nor flatness defect. Thus, the creeping discharge from the peripheral region surface of the AlN substrate 2 may be prevented, and the breakdown voltage may be increased. Therefore, it is possible to prevent the dielectric breakdown, to realize the high breakdown voltage, and to improve the reliability.

Combination of Second with First Embodiments

The first embodiment shown in FIGS. 2A–4B may be combined with the second embodiment. Combined structures that apply the smooth region 2a shown in FIG. 5 to the structures having the solidified insulating material, or the resin 11 shown in FIG. 4A, the thick resin 12 shown in FIG. 4A and the resin 11 with the heaped member 13 shown in FIG. 4B are desirable. According to these structures, both the advantages from the first and second embodiments are obtained at the same time. Coating the resins 11 and 12 over the smooth region 2a may increase the adhesion among the resins 11, 12 and the AlN substrate 2 and the improvement of the reliability to be expected.

Modification of Second Embodiment

To further relax the electric field strength, the solidified insulating material, or the hardened epoxy resin can be provided on the edges of the semiconductor power chips 21, 23 and the control circuitry chip 22 in the structure of the second embodiment or in the structure in combination of the second and first embodiments. If the epoxy resin that has the intermediate dielectric constant between those of the AlN substrate 2 and the silicone gel 91 is coated on the edges of the semiconductor power chips 21 and 23, the electric field at the edge of the top copper film 1a can be relaxed. Containing the powdered $Al_2O_3$ (dielectric constant: about 8.3) in the resins 11–13 may further relax the electric filed and prevent the creeping discharge. The AlN powders may be filled instead of the $Al_2O_3$. Both the $Al_2O_3$ and AlN powders may also be filled together.

(Third Embodiment)

Figure 6:
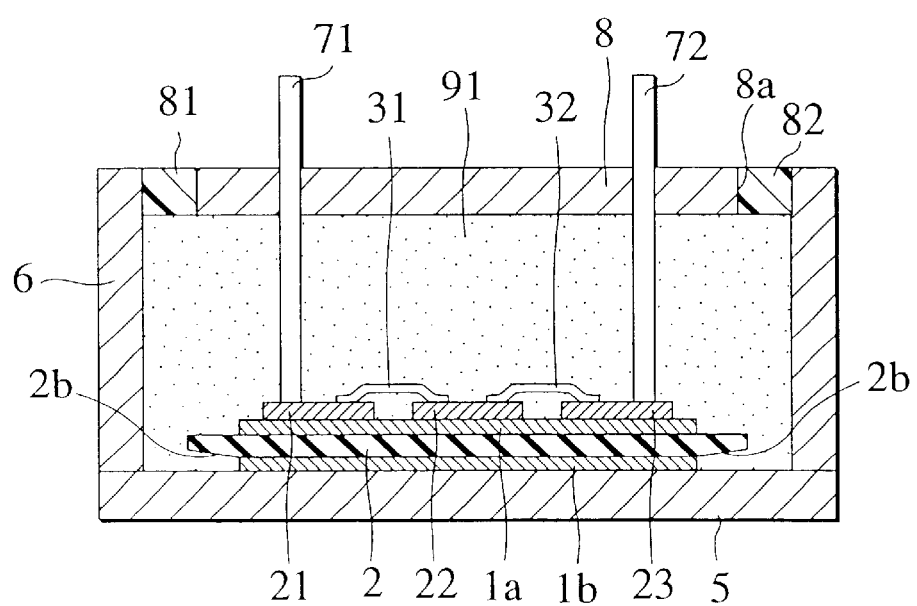
FIG. 6 is a cross sectional view showing a package structure for a semiconductor power device according to a third embodiment of the present invention.

FIG. 6 is a cross sectional view showing a structure of a package for semiconductor power device according to a third embodiment of the present invention. The third embodiment adopts a structure that has a polished smooth region 2b at a bottom surface of an AlN substrate 2, which faces to a conductive bottom plate 5 serving as a heat sink and also opposes to an exposed top surface of a peripheral region of the AlN substrate 2 as shown in FIG. 6, instead of the smooth region 2a at the exposed top surface of the AlN substrate 2 in the second embodiment.

Similar to the second embodiment, the package for a semiconductor power device according to the third embodiment of the present invention employs the AlN substrate 2 that includes a top copper film 1a and a bottom copper film 1b disposed on a top and under a bottom surfaces of the AlN substrate 2, respectively, except the peripheral region by the DBC technique as same as the first embodiment. The top copper film 1a on the AlN substrate 2 is delineated to form a given inner pattern. The semiconductor power chips 21, 23 and the control circuitry chip 22 are mounted on the top copper film 1a. The semiconductor power chips 21 and 23 are connected electrically with the control circuitry chip 22 to each other via bonding wires 31 and 32.

The insulating substrate 2 that mounts the semiconductor chips 21, 22 and 23 thereon is contained within a case 6. The bottom plate, to which the bottom copper film 1b is attached, of the case 6 serves as a heat sink 5 made of a metal. External terminals 71 and 72 are drawn out of the case for making electrical connections with the external of the module from the semiconductor power chips 21 and 23 on the insulating substrate which are connected to control circuitry chip 22 through the bonding wires 31 and 32. The external terminals 71 and 72 are such terminals that supply power to the semiconductor power chips 21, 23 and control circuitry chip 22. A silicone gel 91 is filed within the case 6 to protect the bonding wires 31 and 32. A top surface of the case 6 is covered with a terminal holder 8. An inlet for injecting the silicone gel is generally sealed with resinous sealing materials 81 and 82.

The package for semiconductor power device according to the third embodiment of the present invention adopts such a structure that an exposed bottom surface of the peripheral region in the AlN substrate 2 is polished to make a smooth region 2b having a given surface roughness. The given surface roughness of the smooth region 2b of the AlN substrate 2 in the third embodiment is smaller than 0.05 $\mu$m, which is at least one order smaller than the conventional roughness of the insulating substrate. And it is preferable to polish the smooth region 2b to obtain a mirror like surface. Although a taper is shown to clearly point out the smooth region 2b of the AlN substrate 2, it must be noted that the taper is not required in the third embodiment, since the taper at the smooth region 2b does not relate to the electric field, on the contrary to the top surface of the AlN substrate 2.

The breakdown voltage slightly increases in the third embodiment. The advantages by the polishing are slightly reduced compared to the second embodiment where the exposed top surface of the peripheral region of the AlN substrate 2 is polished. However, the package still have the effectiveness in some extent, and further has an advantage not to require a distinction of the top and bottom surfaces of the AlN substrate 2. The peripheral region of the AlN substrate 2 is not restricted in the configurations shown in FIGS. 5 and 6, and the smooth region 2a of the exposed top surface and the bottom smooth region 2b can be provided at the same time.

Combination of Third with First Embodiment

Combining the structure shown in FIG. 6 with any one of the structures shown in FIGS. 2A–4B with the solidified insulating materials allows for obtaining the advantages from each the structure at the same time. Further, combining the structure that realizes the both structures shown in FIGS. 5 and 6, which has both polished surfaces 2a and 2b, with any one of the structures shown in FIGS. 2A–4B may also allow for obtaining the respective effectiveness from each of the structures stated in the second and third embodiments as well as the effectiveness in the structures shown in FIGS. 2A–4B, at the same time.

(Fourth Embodiment)

Figure 7:
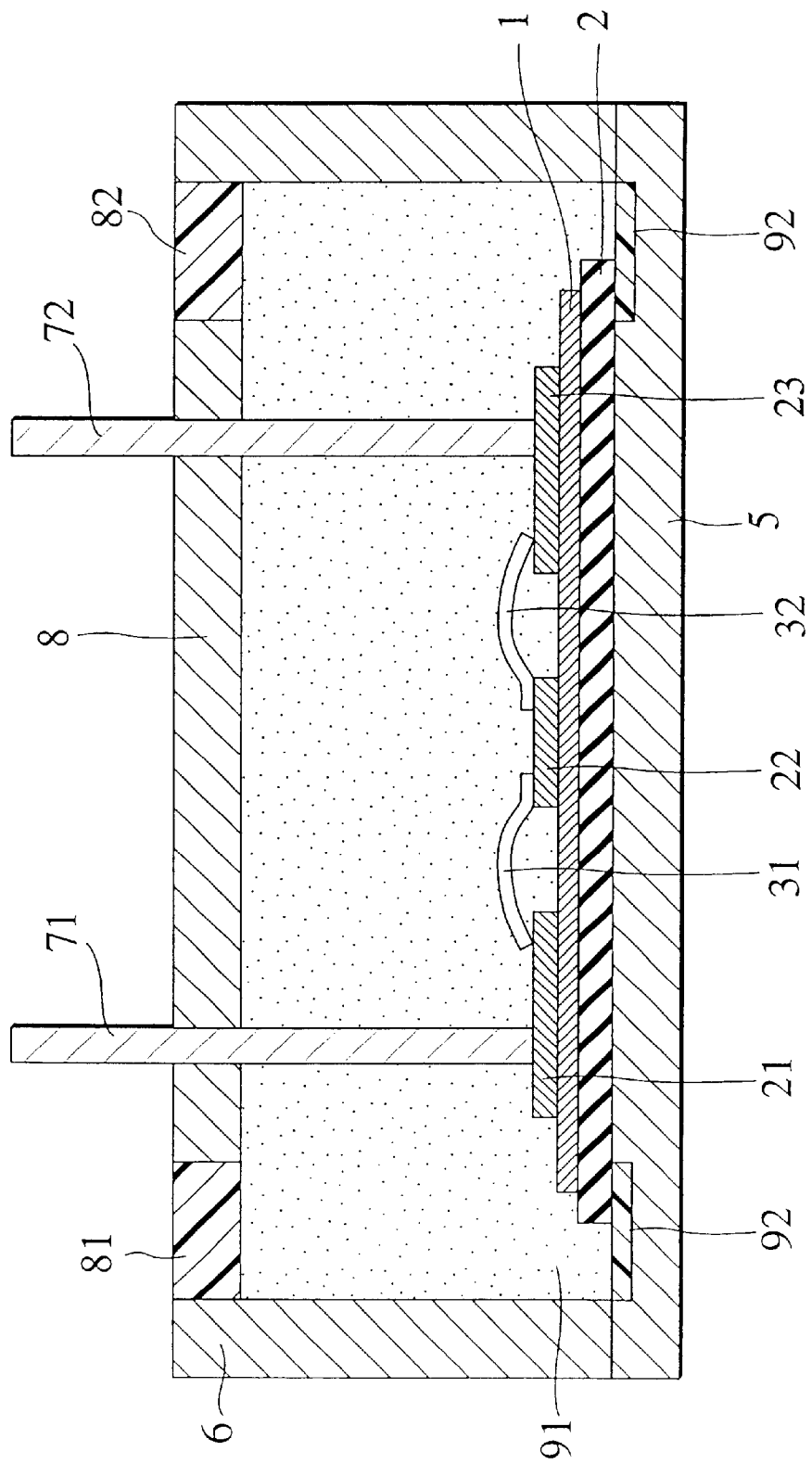
FIG. 7 is a cross sectional view showing a package structure for a semiconductor power device according to a fourth embodiment of the present invention.

FIG. 7 is a cross sectional view showing a structure of a package for a semiconductor power device according to a fourth embodiment of the present invention. The package according to the fourth embodiment of the present invention employs, as an insulating substrate (ceramic substrate) 2, an AlN substrate that has a conductive film 1 such as copper film, or a composite film comprising gold (Au) and nickel (Ni) films, disposed on a top surface except a peripheral region thereof as shown in FIG. 7. In FIG. 7, though the bottom conductive film is omitted, such bottom conductive film can be attached at the bottom of the insulating substrate 2 as shown in the first to third embodiments employing the DBC substrate. Semiconductor power chips 21, 23 and a control circuitry chip 22 for containing control circuitry for controlling these semiconductor power chips are disposed and fixed tightly on the conductive film 1. Various power devices such as the IGBT, the power MOSFET and the power BJT may be used as the semiconductor power chips 21 and 23. The control circuitry may include various control circuits such the CMOS control circuit, the bipolar control circuit and the BiCMOS control circuit. These control circuits may contain other circuits such as the overvoltage protection circuit and the overheat protection circuit. The semiconductor power chips 21 and 23 are connected electrically with the control circuitry chip 22 via bonding wires 31 and 32. Further, as shown in FIG. 7, external terminals 71 and 72 are provided in the package. The external terminals 71 and 72 are such terminals that supply power to the semiconductor power chips 21, 23 and the control circuitry chip 22. Various electronic components including passive elements such as condensers and coils may also be contained in the package.

The insulating substrate 2 on which the semiconductor chips 21, 22 and 23 are mounted is accommodated within a case (container body) 6. A bottom plate of the case to which the insulating substrate 2 is attached serves as a heat sink 5 made of a metal. A silicone gel 91 or an insulating resin is filled within the case (container body) 6 to protect the bonding wires 31 and 32. A top surface of the case (container body) 6 is covered with an upper lid (terminal holder) 8. An inlet for injecting insulating material (inlet for injecting the silicone gel) is generally sealed with resinous sealing materials 81 and 82.

The feature in the structure of the package for semiconductor power device according to the fourth embodiment is characterized in that: a notch or a groove is formed in a part of the conductive bottom plate 5 that serves as the heat sink, which contacts with a bottom surface of the insulating substrate 2 on which the semiconductor chips 21, 22 and 23 are mounted. And a high heat conductive insulating resin 92 is embedded in the notch (groove).

In general, the creeping discharge caused in one surface of the insulating substrate may develop easily when another surface of the substrate consists of a conductor. Therefore, digging a grooved portion (notched portion), at the peripheral region of the insulating substrate 2, at the surface of and in the metallic heat sink 5 and filling the grooved portion (notched portion) with the insulating resin 92 as shown in FIG. 7 can prevent the development of the discharge. In addition, by digging the grooved portion (notched portion), the creeping distance may be extended, and the creeping breakdown voltage can be increased.

A larger depth of the notched portion is desired to extend the creeping distance as long as the conductive bottom plate 5 serving as the heat sink can suffer to be used. The creeping breakdown voltage that folds back around the insulating substrate 2 from the semiconductor chips 21 and 23 is desired to be higher than the creeping breakdown voltage that ravels through the edge of the insulating substrate 2 from the semiconductor chips 21, 22 and 23 and reaches directly to the buried resin 92 and further penetrates through the buried resin 92.

A start position of the notched portion that is formed in the conductive bottom plate 5 or the heat sink is desirable to be located outwardly apart from the peripheral of the semiconductor chips 21, 22 and 23. If the notch portion is formed directly beneath the semiconductor chips 21, 22 and 23, the thermal conduction and heat radiation effects from the semiconductor chips 21, 22 and 23 will be insufficient.

The insulating substrate 2 generally used is mostly thin so as to increase the thermal conduction and heat radiation effects and to reduce the cost. Therefore, it is preferable to form the notched portion outwardly at least from the edges of the semiconductor chips 21, 22 and 23 in order to avoid the penetrative puncture in the insulating substrate 2 due to the concentration of the electric field.

Injecting filling materials such as the silicone gel and other insulating resins into the notched portion that is formed in the conductive bottom plate or the heat sink can achieve the effectiveness to prevent the creeping breakdown. Injecting the high heat conductive insulating resin 92 into the notched portion can also realize the good thermal conduction and heat dissipation effects as mentioned above. An insulating resin that is mixed with a high heat conductive material may also be employed instead of the high heat conductive insulating resin 92. It is also desirable to contact the injected resin tightly with the insulating substrate 2 without making any openings between the resin and the notched portion in order to obtain the good thermal radiation effect.

Whereas the surface of the high heat conductive insulating resin 92 injected into the notched portion is flattened as shown in FIG. 7, the high heat conductive insulating resin 92 can be heaped up to a position corresponding to the top surface of the insulating substrate 2. Burying a resin with a resistivity smaller than that of the insulating substrate 2 or a semi-conducting resin into the notched portion may also relax the electric field strength. The geometrical start position to be notched, or the shoulder of the groove may be made roundly. A cross sectional shape of the notched portion (grooved portion) is not restricted to a rectangle shape, but can be various shapes such as a mesa shape and a triangle shape.

(Fifth Embodiment)

Figure 8:
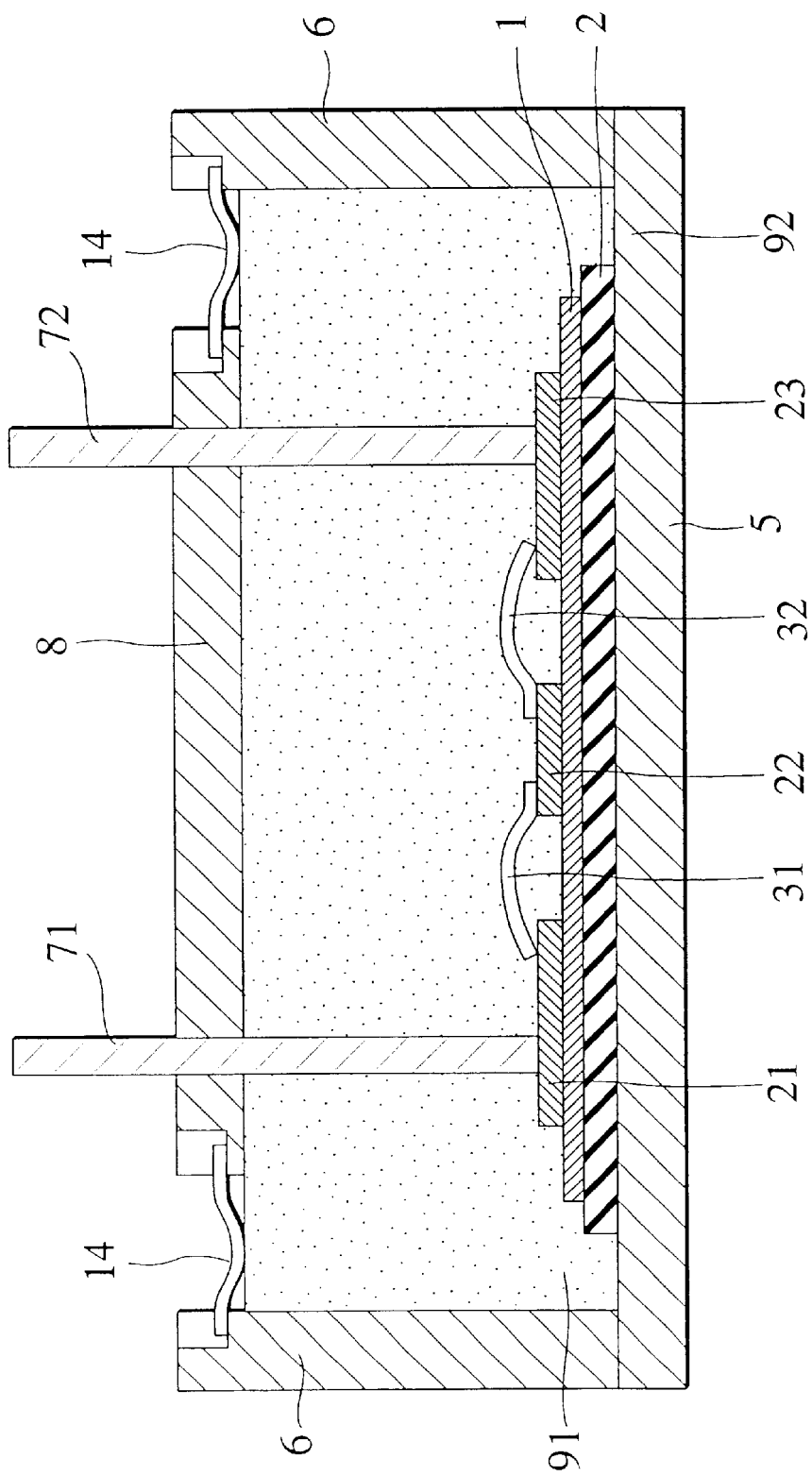
FIG. 8 is a cross sectional view showing a package structure for a semiconductor power device according to a fifth embodiment of the present invention.

FIG. 8 is a cross sectional view showing a structure of a package for a semiconductor power device (semiconductor module) according to a fifth embodiment of the present invention. An essential configuration of the semiconductor module according to the fifth embodiment is mostly similar with the semiconductor module already explained in the fourth embodiment, so the duplicated items between them are omitted to explain. The feature of the present semiconductor module is characterized in that an inlet for injecting insulating material (inlet for injecting the silicone gel), which is located at outside an upper lid (terminal holder) in an inner portion of a case (container body) 6, is sealed with a flexible and waterproof film 14 that is in a loosen state.

In the fifth embodiment of the present invention, the flexible and waterproof films 14 having thickness of 10 to 100 μm are fixed as shown in FIG. 8. The flexible and waterproof film 14 may be, for example, plastic film such as polytrifluoroethylene chloride film, vinylidene chloride-vinyl chloride copolymer film, etc. As shown in FIG. 8, parts of the case (container body) 6 and a terminal holder 8 are dug to form notched portions. Then an adhesive is attached to the walls of the notched portions. After that, the flexible and waterproof films 14 are attached thereon. Although not shown in FIG. 8, notched members with an adhesive are adhered onto the films to cover the films 14. Instead of adhesion, a thermal fusion method may be applied to fix the flexible and waterproof films 14 to the notched portions. Or, the flexible and waterproof films 14 may be buried in one or both of the case (container body) 6 and terminal holder 8 in advance. The films 14 are desirable to have a good electrical insulating property, but a metallic film such as an aluminum film may also be employed. If the metallic film is employed, it is important to pay attention to keep a good electrical insulating structure against a high voltage portion in order to prevent the discharge therebetween.

Thus, the sealing of the inlet for injecting the silicone gel with the slightly loosen flexible waterproof film 14 can relax the generation of the heat stress, because the flexible and waterproof film 14 deforms flexibly when the thermal expansion or shrinkage due to the variation of temperatures occurs in the silicone gel. The generation of the breakage and faulty operation of the module due to the expansion and shrinkage of the silicone gel in response to the thermal variations can be suppressed accordingly. The flexible and waterproof film 14, which does not allow moisture to penetrate literally, can prevent the silicone gel from absorbing humidity, as similar as the conventional sealing resin that seals the inlet for injecting the silicone gel.

The film to be employed is preferable to have not only the property of flexible and waterproof but also a property capable of suffering the heat stress. A property capable of adhering tightly with the case (container body) is also required to the film An approach to realize such the film, a multi-layer structure that comprises in combination two or more different films, which are selected from a group consisting of a waterproof film, a film with a better adhesive property than that of the waterproof film and a film with a stronger strength property against the heat stress than that of the waterproof film, may be applied.

The film may have a multi-layer structure that is stacked with a waterproof film and a metallic film. Or, the film may have a multi-layer structure sandwiching the waterproof film with a couple of more flexible and adhesive films such as polyethylene films. The film may also have a multi-layer structure having at least one layer of a higher adhesive film compared to those of other stacked films, the film is adhesive against the film fixing plane around the notched portion, or around the inlet for injecting insulating material of the package.

(Sixth Embodiment)

Figure 9:
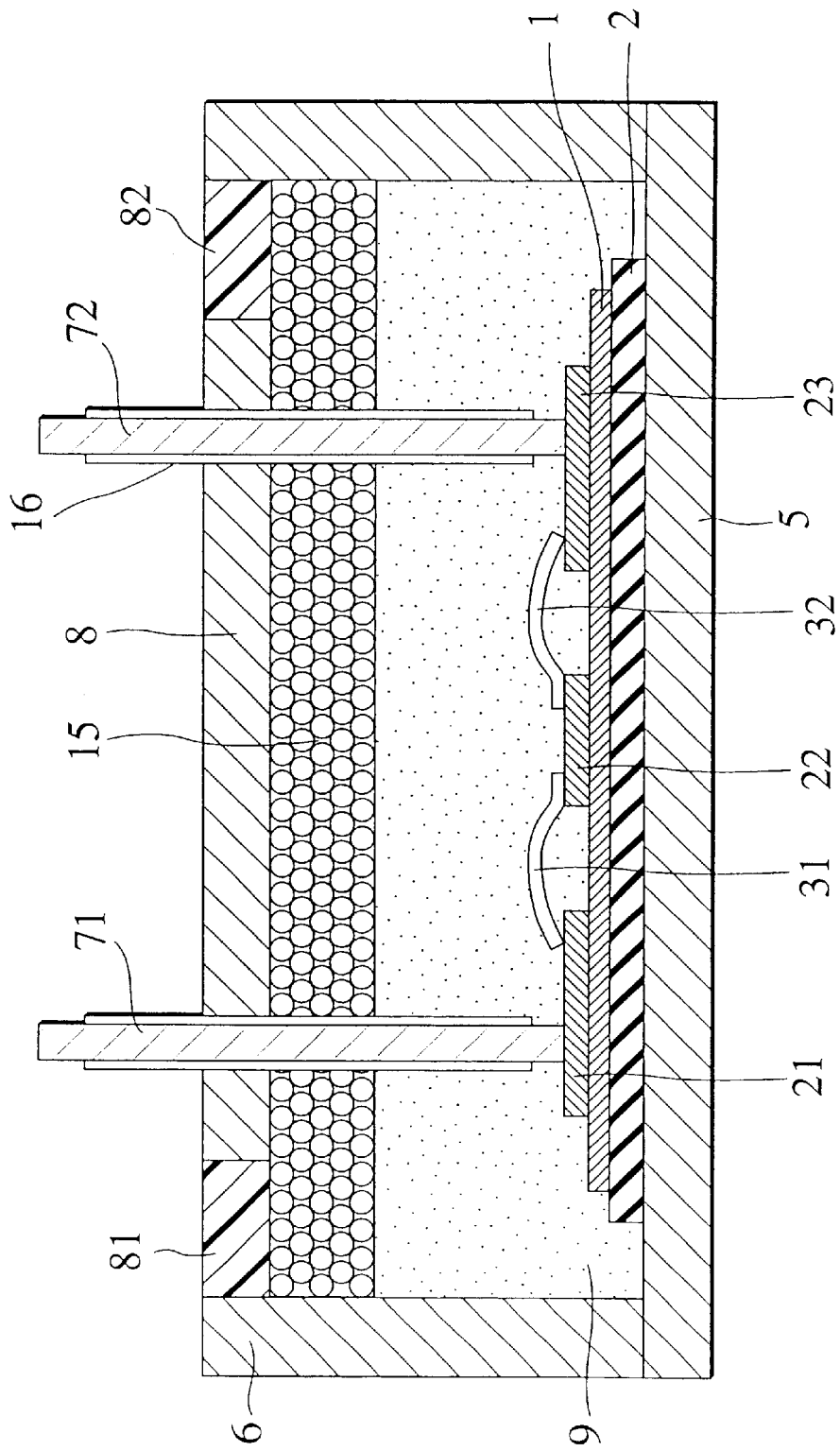
FIG. 9 is a cross sectional view showing a package structure for a semiconductor power device according to a sixth embodiment of the present invention.

FIG. 9 is a cross sectional view showing a structure of a package for a semiconductor power device according to a sixth embodiment of the present invention. An essential configuration of the package for semiconductor power device according to the sixth embodiment is mostly similar with the semiconductor module according to the fourth and fifth embodiments, so the duplicated items among them are omitted to explain. A main feature of the present semiconductor module is characterized in that an insulating material (silicone gel) 91 is filled within a case (container body) 6 up to an intermediate height, and that a form 15 is filled onto the insulating material 91. Namely, a top surface of the silicone gel 91 is covered with the form 15.

It is desired that bubbles are separated from each other and distributed uniformly in the form 15 to prevent the discharge, and that the form 15 contacts tightly with the silicone gel 91 and also with the terminal holder 8.

In the case where the form 15 is employed, since external terminals 71 and 72 are required to pass through the form 15 that has a relatively lower dielectric breakdown voltage, an insulating sheath 16 is used to cover the surface of the lead wires. The insulating sheath 16 can be made of resin. The insulating sheath 16 for the external terminals 71 and 72 may increase a breakdown voltage between terminals in a terminal holder 8 if the sheath is used to cover not only a filling region of the form 15 but an upper portion of the terminal holder 8. This structure and associated effectiveness can be applied to the structures of the package for semiconductor power device according to the other embodiments.

The insulating sheath 16 for the external terminals 71 and 72 is required to pass through the terminal holder 8 and the silicone gel 91, so if the dielectric constant of the sheath is smaller than those of the materials, the electric field near the external terminals 71 and 72 may become larger rather than that in the case where the external terminals 71 and 72 are not covered with the insulating sheath 16. Therefore, the insulating sheath 16 is desired to have a dielectric constant higher than that of the terminal holder 8, and that of the form 15 as well.

(Seventh Embodiment)

Figure 10:
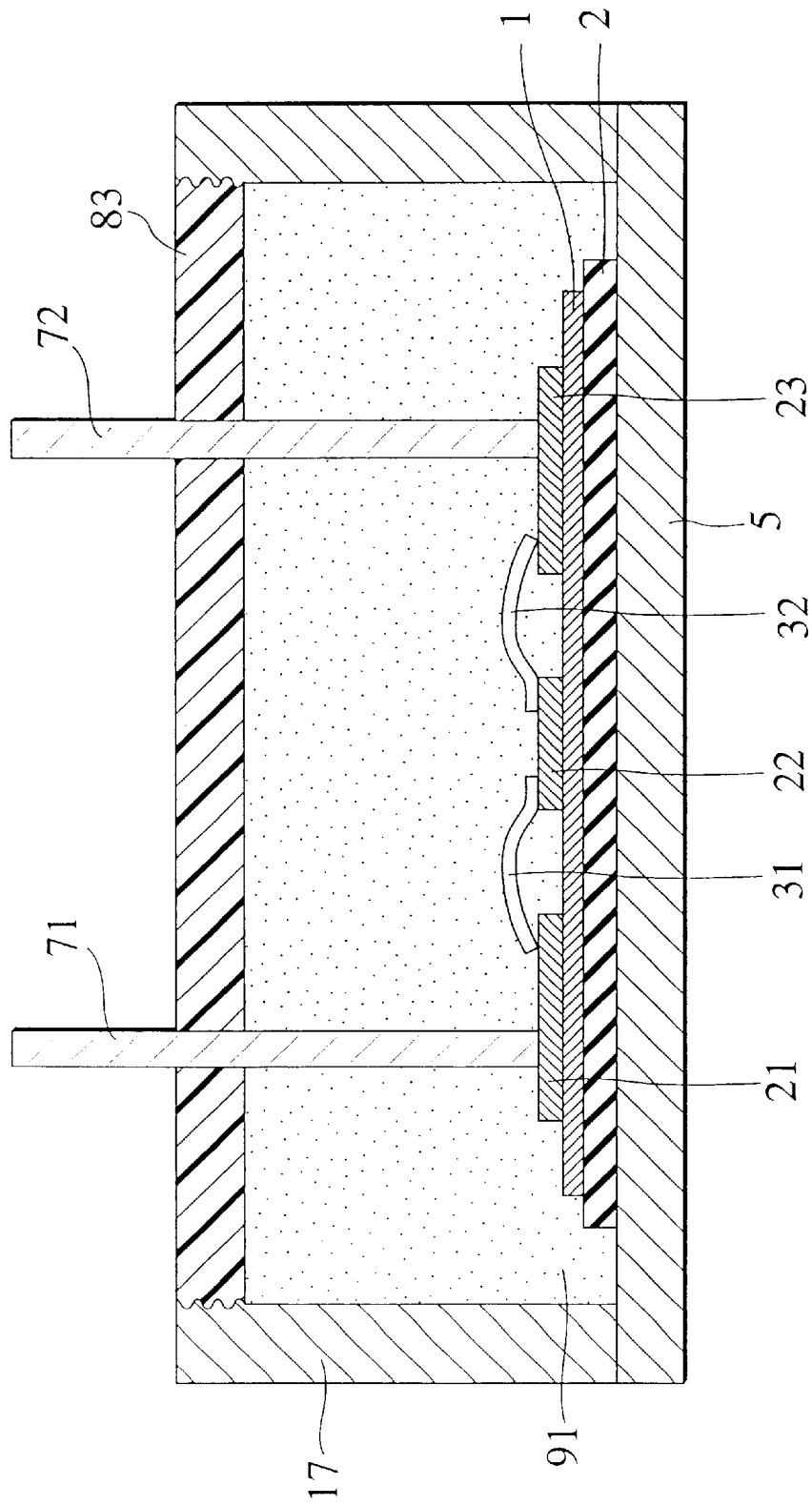
FIG. 10 is a longitudinal cross sectional view showing a package structure for a semiconductor power device according to a seventh embodiment of the present invention.

FIG. 10 is a cross sectional view showing a structure of a package for a semiconductor power device according to a seventh embodiment of the present invention. An essential configuration of the package for semiconductor power device according to the seventh embodiment is mostly similar with the semiconductor module according to the fourth through sixth embodiments, so the duplicated items among them are omitted to explain.

A main feature of the present semiconductor module is characterized in that there is employed a case (container body) 17 that has a jog portion in the form of steps or waves on a side (inner wall) of an upper aperture corresponding to an adhering portion with sealing members 81 and 82.

An entire top surface of the case (container body) 17 is covered with a sealing member 83 which has another jog portion that corresponds to the jog portion on the side of the aperture of the case 17, instead of the conventional terminal holder. The terminal holder can also be attached to the case in such a manner that the holder is covered partly with the sealing member 83 that has a jog portion. In such the case, it is desirable to form step or wave shapes on the side of the upper portion of the terminal holder.

Thus, an adhered interface distance between the sealing resin 91 and the case (container body) is extended substantially by means of the step- or wave-shape jog portion formed on the side of the upper portion of the case (container body) 17 at an adhered interface between the sealing member 83 and the case (container body) 17. Moisture penetration into the case (container body) may usually occur through such the adhered interface. It is generally well known that an amount of moisture that penetrates diffusively through the interface may decrease down to $1/n^2$ if the adhered interface distance becomes n times. Therefore, employing the case that has a sealed portion with the step- or wave-shaped jog portion can prevent substantially the moisture penetration into the case, and can realize a semiconductor module that has an advantageous hygroscopic property and a high reliability.

(Eighth Embodiment)

Figure 11:
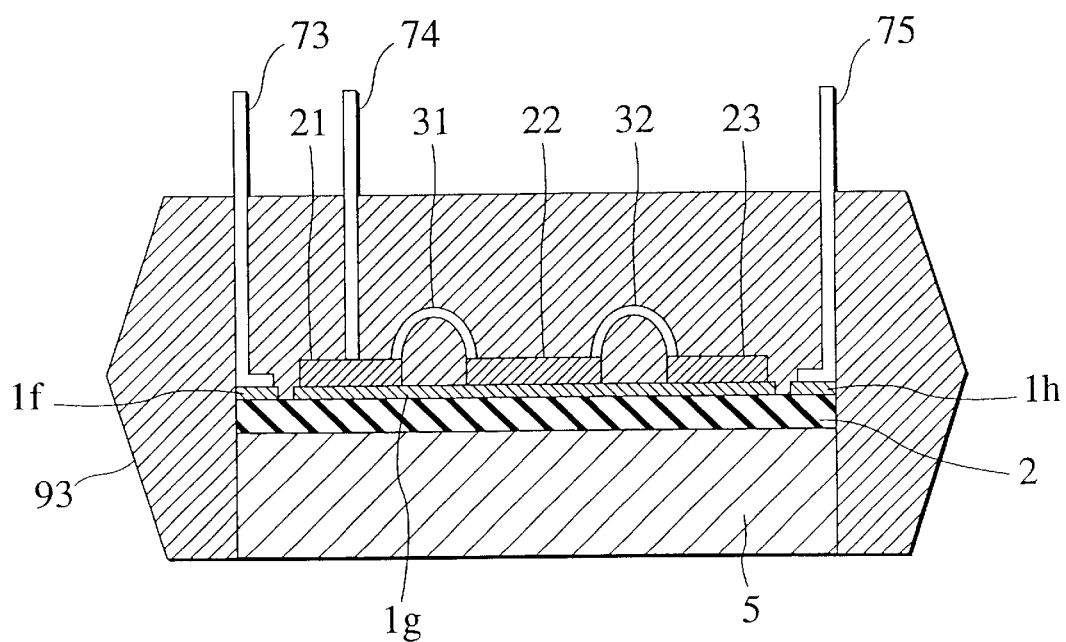
FIG. 11 is a longitudinal cross sectional view showing a structure of a package for a semiconductor power device according to an eighth embodiment of the present invention.

FIG. 11 is a longitudinal cross sectional view showing a structure of a package for a semiconductor power device according to an eighth embodiment. The semiconductor device according to the eighth embodiment comprises a heat sink (conductive bottom plate) 5, an insulating substrate 2 disposed on the heat sink (metallic base) 5, semiconductor power chips 21 and 23 disposed on the insulating substrate 2, and external terminals 73 and 75 connected onto the insulating substrate 2. An external terminal 74 connected onto the semiconductor power chip 21, a control circuitry chip 22 for containing a control circuit disposed on the insulating substrate 2, and bonding wires 31 and 32 for connecting the semiconductor power chips 21 and 23 electrically with the control circuitry chip 22 are further provided. The external terminals 73 and 75 are such terminals that supply power to the semiconductor power chips 21, 23 and the control circuitry chip 22. The entire semiconductor device is sealed with a thermoplastic insulating resin 93, and has an outer size of about 100 mm×70 mm×10 mm, for example. External connection ends of the external terminals 73, 75 and 74 are drawn out to an upper portion of the package through the thermoplastic insulating resin 93 which is formed by injection-molding.

As the semiconductor power chips 21 and 23, various power devices such as IGBTs, Power MOSFETs, Power BJTs, Power SITs, Thyristors, GTO Thyristors and SI Thyristors can be available. As the control circuit, an nMOS control circuit, a PMOS control circuit, a CMOS control circuit, a Bipolar control circuit, a BiCMOS control circuit and an SIT control circuit can be employed. These control circuits may contain an overvoltage protection circuit, an overcurrent protection circuit and an overheat protection circuit. As the bonding wires 31 and 32, such bonding wires and bonding strips as made of gold (Au), copper (Cu) and aluminum (Al) can be available. Various electronic components, for example, passive elements such as condensers and coils, and a circuit such as a power supply may be mounted. A multi-layer structure that comprises plural layers of insulating substrate materials can be applied to the insulating substrate to improve the electric performance of the entire package by increasing the insulating property. A vacuum pressure impregnation treatment for impregnating an insulating resin into the insulating substrate in advance can improve the insulating property as well.

In the above configuration, there is used a resin that has a main constituent of a polyphenylene sulfide filled with inorganic fillers such as aluminum nitride (AlN) powders and short glass fibers as the thermoplastic insulating resin 93. Thus, the thermal expansion that occurs in the case where the silicone gel material is employed as the sealing material can be eliminated. As the result, no empty space is required to exist within the package, and the miniaturization of the package size than that of the conventional one and the reduction of the production cost can be achieved. The number of the materials required for producing the package can be reduced compared to that of the prior art, resulting in shortening a time necessary to assemble the package for semiconductor device.

The entire package for semiconductor device is integrated in the thermoplastic insulating resin 93, and the resin itself has a high waterproof property, so the moisture penetration from external can be prevented.

Figure 12:
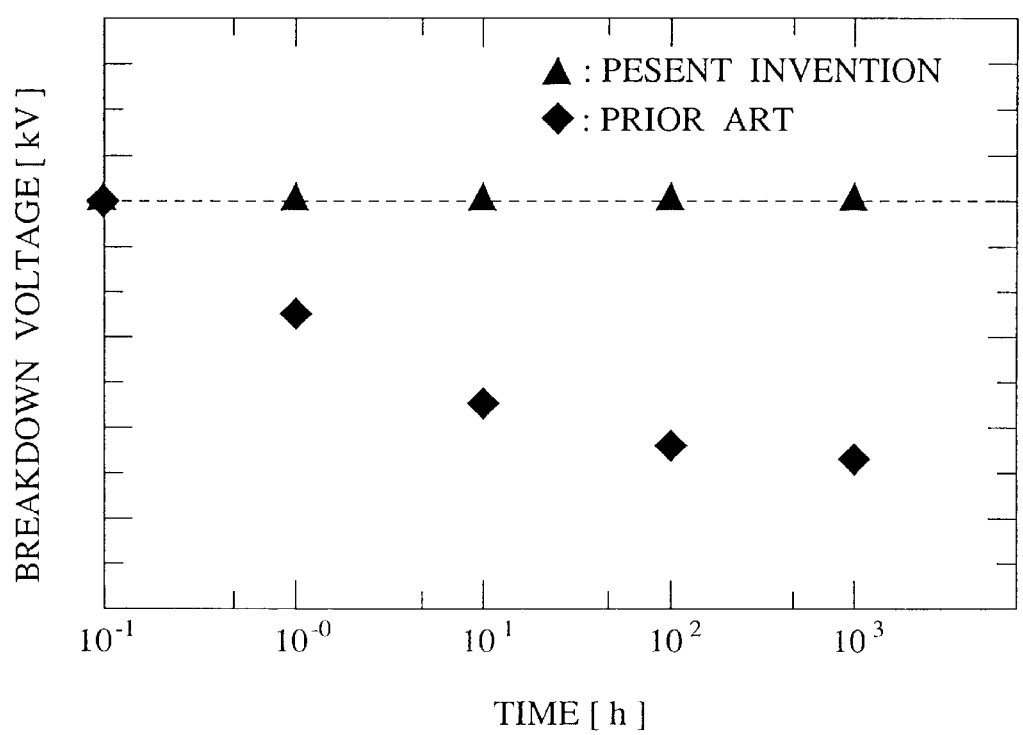
FIG. 12 is a diagram showing a result of a breakdown voltage test for the package for semiconductor device according to the eighth embodiment in comparison with a result of the prior art.

To clarify the advantageous waterproof property of the package for semiconductor power device according to the eighth embodiment of the present invention, the waterproof property of the package for semiconductor device in the prior art is compared with that of the package for semiconductor device according to the eighth embodiment. FIG. 12 is a diagram showing a result of a breakdown voltage test for the package for semiconductor device in the prior art and also the package for semiconductor device according to the eighth embodiment. The breakdown voltage test is performed by leaving both the packages for semiconductor devices under an environment of 90% moisture at 60° C. for a given time period, and thereafter applying a voltage to the semiconductor devices with raising the voltage gradually up to 4.5 kV and checking the breakdown voltage of the semiconductor devices.

As obvious from FIG. 12, because the breakdown voltage of the conventional package for semiconductor device decreases in conjunction with the exposure time elapsing, it is understood that the electric property of the semiconductor device degrades by being affected from the external environment. To the contrary, because the breakdown voltage of the package for semiconductor device according to the present invention always maintains a certain value without reference to the exposure time, it is understood that the electric property thereof is not affected from the external environment, and that the durability and the waterproof property are greatly improved in comparison with the conventional semiconductor device.

Modifications of Eighth Embodiment

MODIFICATION 1: FIG. 13A is a longitudinal cross sectional view showing a modification (MODIFICATION 1) of a package for semiconductor device according to the eighth embodiment. In the MODIFICATION 1, a variation is given to the shape of the heat sink (conductive bottom plate) 5 of the eighth embodiment. Namely, a recess is formed in a lower part of a heat sink (metallic base) 5a to realize a structure that enables to receive a thermoplastic insulating resin 93 in the bottom part of the package. The structure allows the thermoplastic insulating resin to exist in both the upper and bottom surfaces of the semiconductor device. If the thermoplastic insulating resin exists only in one surface, the heat stress due to the heat shrinkage of the resin applies only on the one surface. As the result, the semiconductor chip may be introduced into a defect state by distortion, for example. To the contrary, in the case where the thermoplastic insulating resins 93 are disposed on both the surfaces of the semiconductor device, even if the heat stress occurs and applies any forces to both the surfaces of the semiconductor device, the forces may balance with each other. Thus, a resultant force applied to the semiconductor device can be reduced, and the durability and reliability of the semiconductor device can be improved.

MODIFICATION 2: FIG. 13B is a longitudinal cross sectional view showing another modification (MODIFICATION 2) of a package for semiconductor device according to the eighth embodiment. The semiconductor device according to the MODIFICATION 2has a notch formed on a lower part of a metallic base 5b for the purpose of obtaining the same functions, results and advantages as those of the semiconductor device shown in FIG. 13A.

Figure 14A:
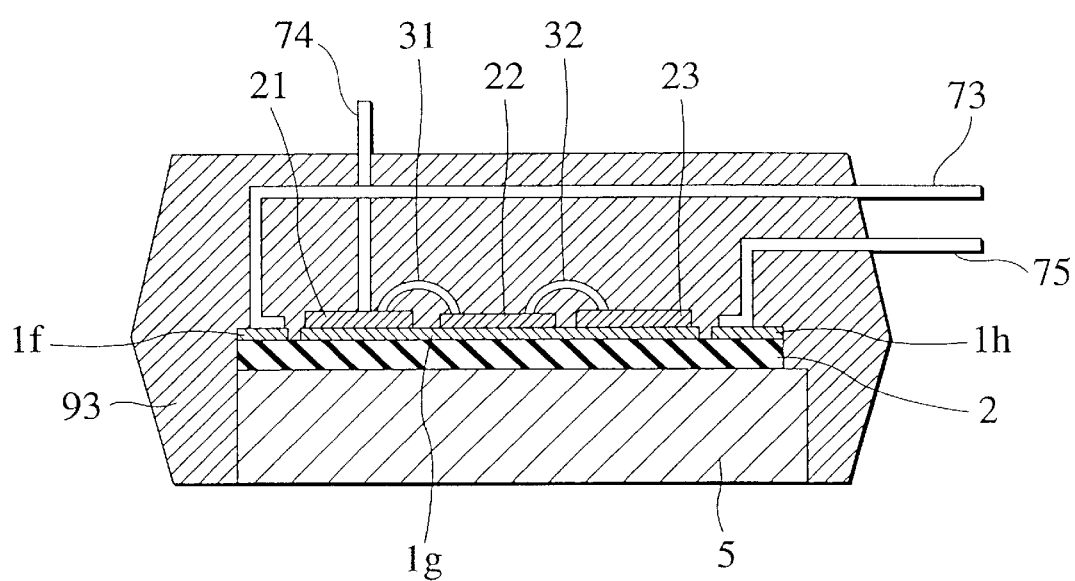
FIG. 14A is a longitudinal cross sectional view showing a package structure for a semiconductor power device according to a different modification (MODIFICATION 3) of the eighth embodiment of the present invention.

MODIFICATION 3: FIG. 14A is a longitudinal cross sectional view showing a further modification (MODIFICATION 3) of a package for semiconductor device according to the eighth embodiment. In the package for semiconductor device according to the MODIFICATION 3, the external connection ends of the external terminals 73 and 75 of the semiconductor device shown in FIG. 11 are drawn out through a side portion of the package rather than the upper portion of the package for semiconductor device. As a result, the entire package can be made thinner than the package for semiconductor device of the eighth embodiment. In addition, the thermoplastic insulating resin can be easily molded, and the misalignment and deformation during the molding occurred on the constituents of the device such as electric components can be prevented.

Figure 14B:
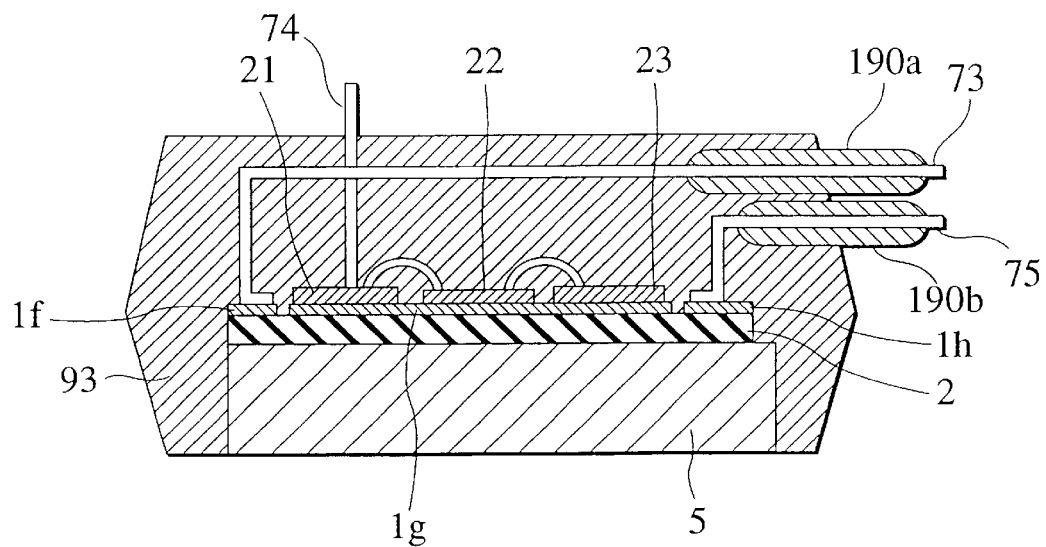
FIG. 14B is a longitudinal cross sectional view showing a package structure for a semiconductor power device according to a further different modification (MODIFICATION 4) of the eighth embodiment of the present invention.

MODIFICATION 4: FIG. 14B is a longitudinal cross sectional view showing a different modification (MODIFICATION 4) of a package for semiconductor device according to the eighth embodiment. The package for semiconductor device according to the MODIFICATION 4 has a feature that surfaces of the external terminals 73 and 75 are coated with insulating coatings 190a and 190b in the package for semiconductor device shown in FIG. 14A. As the result, a short-circuit that will be occurred between the external terminals can effectively prevented. The presence of the insulating coatings can further shorten the distance between terminals, and can realize a further miniaturized and thinned package.

Figure 14C:
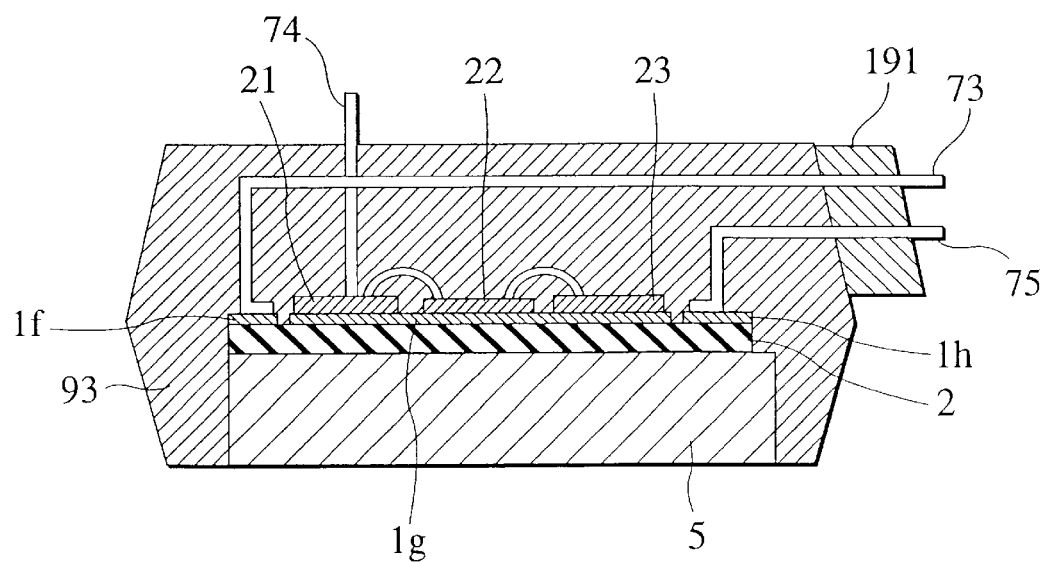
FIG. 14C is a longitudinal cross sectional view showing a package structure for a semiconductor power device according to a further modification (MODIFICATION 5) of the eighth embodiment of the present invention.

MODIFICATION 5: FIG. 14C is a longitudinal cross sectional view showing a further different modification (MODIFICATION 5) of a package for semiconductor device according to the eighth embodiment. The package for semiconductor device according to the MODIFICATION 5 has a feature in which an insulating resin 191 is used for molding a surface of the thermoplastic insulating resin 93 near a portion where the external connection ends of the external terminals 73 and 75 are drawn out in the package for semiconductor device shown in FIG. 14A. According to the above structure, the same functions, results and effects as those of the packages for semiconductor devices shown in FIGS. 12A and 12B can be obtained. In addition, the external connection ends of the external terminals can be supported firmly.

Figure 15:
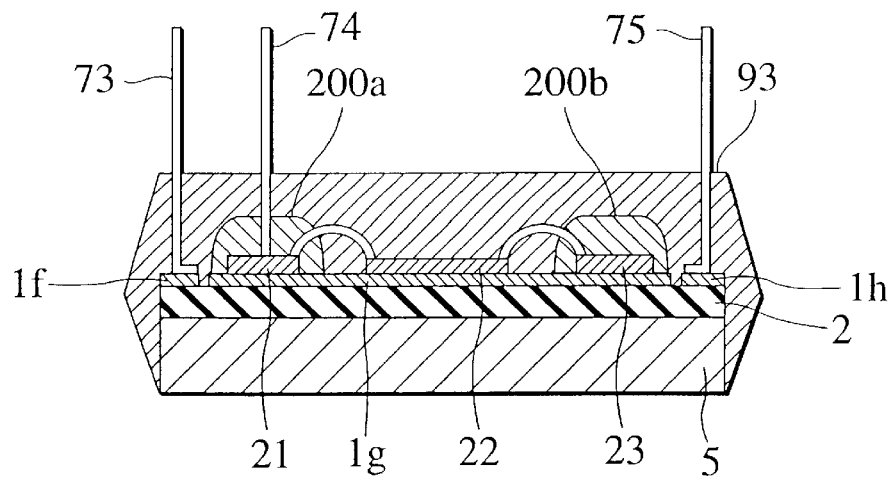
FIG. 15 is a longitudinal cross sectional view showing a package structure for a semiconductor power device according to a further modification (MODIFICATION 6) of the eighth embodiment of the present invention.

MODIFICATION 6: FIG. 15 is a longitudinal cross sectional view showing a further different modification (MODIFICATION 6) of a package for a semiconductor power device according to the eighth embodiment. The package for semiconductor power device according to the MODIFICATION 6 has a feature in which buffering members 200a and 200b are used for coating surfaces of the semiconductor power chips 21 and 23. Thus, the heat stress applied to other elements in the device from the semiconductor power chip or one of the largest heat sources in the package for semiconductor device can be relaxed.

Figure 16A:
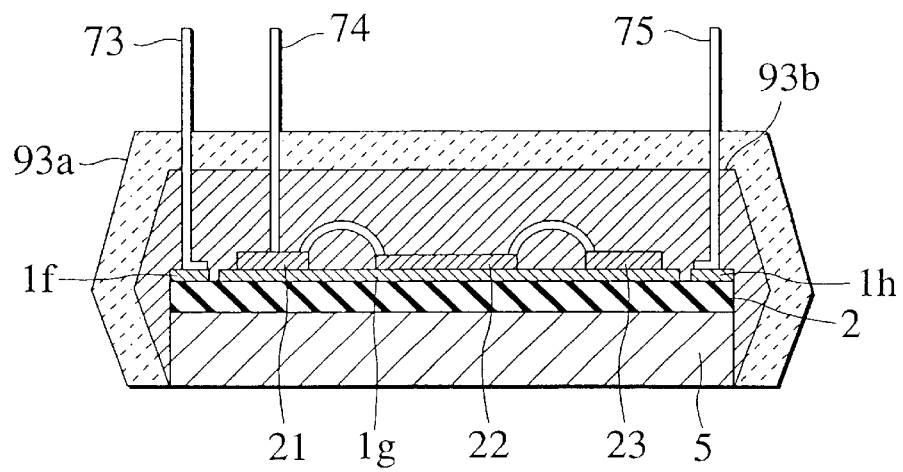
FIG. 16A is a longitudinal cross sectional view showing a package structure for a semiconductor power device according to a further modification (MODIFICATION 7) of the eighth embodiment of the present invention.

MODIFICATION 7: FIG. 16A is a longitudinal cross sectional view showing a further different modification (MODIFICATION 7) of a package for semiconductor device according to the eighth embodiment. The package for semiconductor device according to the MODIFICATION 7 has a feature in which the thermoplastic insulating resin has a two-layer structure that consists of a resin 93a for surface layer and a flexible inner resin 93b in the package for semiconductor device shown in FIG. 11. Thus, the heat stress occurred inside the resin 93a for surface layer can be relaxed by the inner resin 93b. The two-layer structure of the thermoplastic insulating resin may preferably be produced by the sandwich-molding.

Figure 16B:
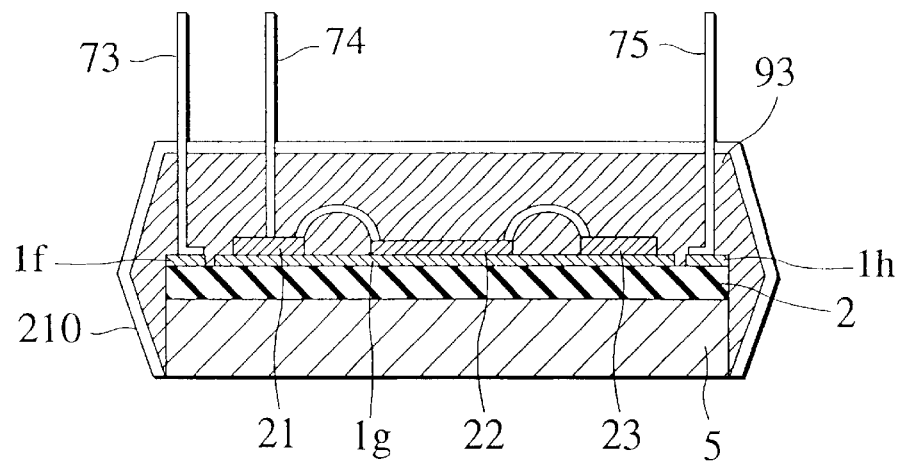
FIG. 16B is a longitudinal cross sectional view showing a package structure for a semiconductor power device according to a further modification (MODIFICATION 8) of the eighth embodiment of the present invention.

MODIFICATION 8: FIG. 16B is a longitudinal cross sectional view showing a further different modification (MODIFICATION 8) of a package for semiconductor device according to the eighth embodiment. The package for semiconductor device according to the MODIFICATION 8 has a feature in which a surface of the thermoplastic insulating resin 93 is covered with a heat-resistant protection film 210 in the package for semiconductor device shown in FIG. 11. Thus, the broken resins can be prevented from scattering to outer atmosphere when accidents such as the overcurrent occur on the package. It is also preferable to employ a heat-resistant polymer film such as polyimide based materials and fluorine based materials for the material of the heat-resistant protection film.

(Ninth Embodiment)

Figure 17A:
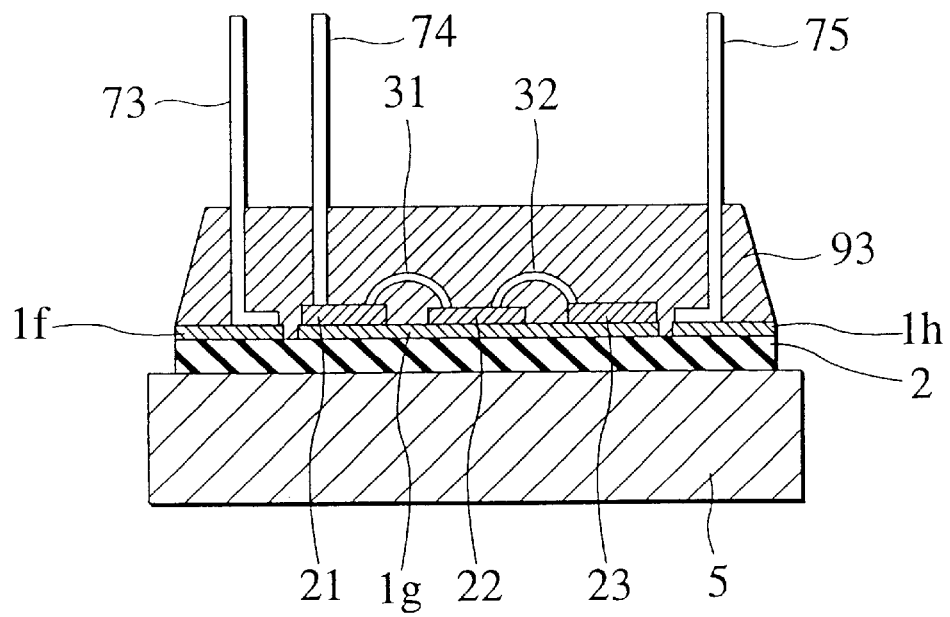
FIG. 17A is a longitudinal cross sectional view showing a package structure for a semiconductor power device according to a ninth embodiment of the present invention.

FIG. 17A is a longitudinal cross sectional view showing a structure of a package for a semiconductor power device according to a ninth embodiment. The semiconductor device according to the ninth embodiment comprises a heat sink (conductive bottom plate) 5, an insulating substrate 2 disposed on the heat sink (metallic base) 5, semiconductor power chips 21 and 23 disposed on the insulating substrate 2 and external terminals 73 and 75 connected onto the insulating substrate 2. The semiconductor power chips 21 and 23 are connected electrically to the control circuitry chip 22 merging control circuitry via bonding wires 31 and 32, respectively. Other electronic components as well as the semiconductor power chip 21, 23, the control circuitry chip 22 and the bonding wires 31 and 32 are sealed with a thermoplastic insulating resin 93. The thermoplastic insulating resin 93 is applied not to contact with the conductive bottom plate 5. External connection ends of the external terminals 73, 75 and an external terminal 74 are drawn out to an upper part of the package through the thermoplastic insulating resin. The thermoplastic insulating resin 93 is molded by the injection-molding.

The same functions, results and effects as those of the package for semiconductor device explained in the aforementioned modifications of the eighth embodiment can also be obtained in the structure of the ninth embodiment according to the present invention. Namely, improvement of the waterproof property of, miniaturization of the size of, and the reduction of the assembling time of the package can be realized.

There is also a function and an effectiveness that is derived only from the configuration of the ninth embodiment of the present invention. Namely, the ninth embodiment of the present invention reduces a mold thickness and further reduces a used amount of the thermoplastic insulating resin 93, by injection-molding the thermoplastic insulating resin 93 onto only the insulating substrate 2 without contacting the conductive bottom plate 5. There is a further function and advantage that improves the durability and the reliability of the package for semiconductor device, and that reduces the problems such as deformation of the device constituents during the injection-molding, because the injection-molding is performed easily, and then, the assembling time can be made shortened.

Modification of Ninth Embodiment

Figure 17B:
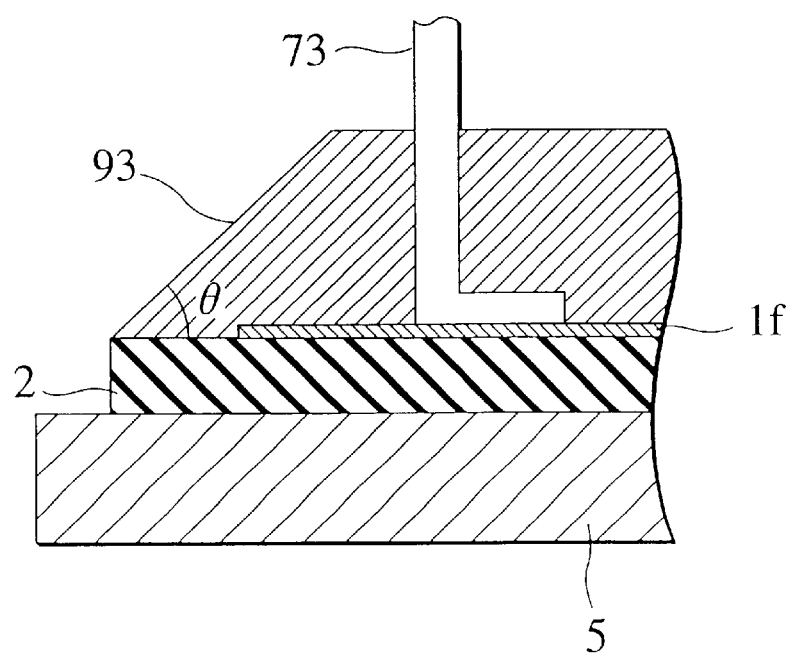
FIG. 17B is a partially expanded longitudinal cross sectional view showing a package structure for a semiconductor power device according to a modification of the ninth embodiment of the present invention.
Figure 18:
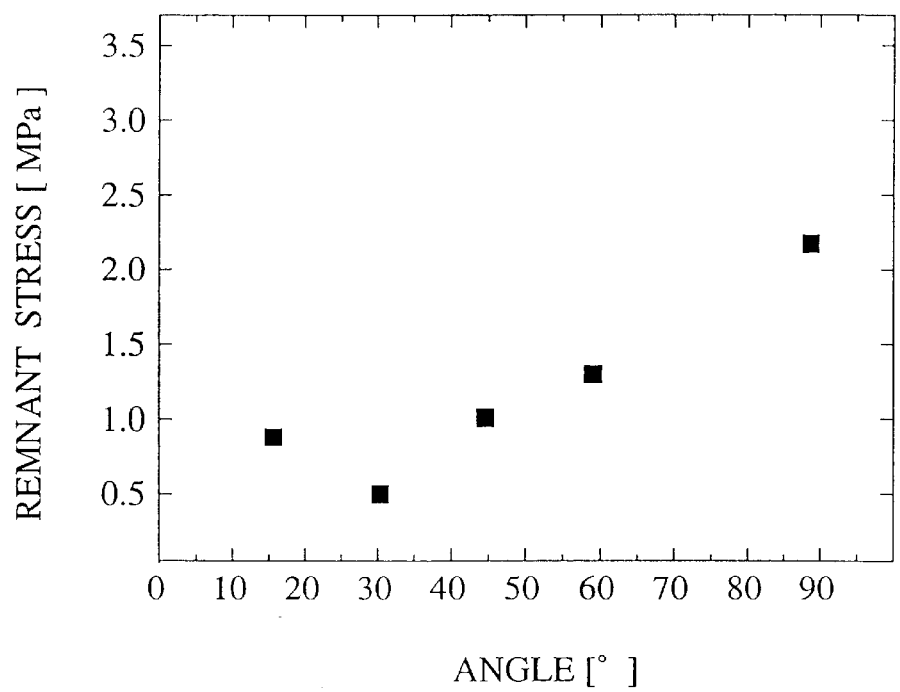
FIG. 18 is a diagram showing a variation of remnant stress in a thermoplastic resin in response to a variation of an angle at a molded side of the thermoplastic resin in the package structure for semiconductor power device according to the ninth embodiment of the present invention.

FIG. 17B is a longitudinal cross sectional view showing a structure of a package for semiconductor power device according to a modification of the ninth embodiment. The package for semiconductor device according to the modification of the ninth embodiment has a feature in which an angle (angle at the molded side) θ between the plane of the insulating substrate 2 and that of the thermoplastic insulating resin 93 is adjusted to an optimum value. This is because of the fact that by alternating the angle θ at the molded side, the residual stress inside the thermoplastic insulating resin is suppressed in the modification of the ninth embodiment. A variation of the residual stress inside the thermoplastic insulating resin in conjunction with the variation of the angle θ at the molded side will be shown below. FIG. 18 illustrates a variation of a remnant stress of the thermoplastic insulating resin in conjunction with the variation of the angle at the molded side. As obvious from FIG. 18, the remnant stress inside the thermoplastic insulating resin varies in conjunction with the variation of the angle at the molded side and reaches to the minimum where the angle θ at the molded side is equal to 30°. Therefore, the angle θ at the molded side is set to 30° to obtain a higher reliability in the ninth embodiment.

(Tenth Embodiment)

Figure 19:
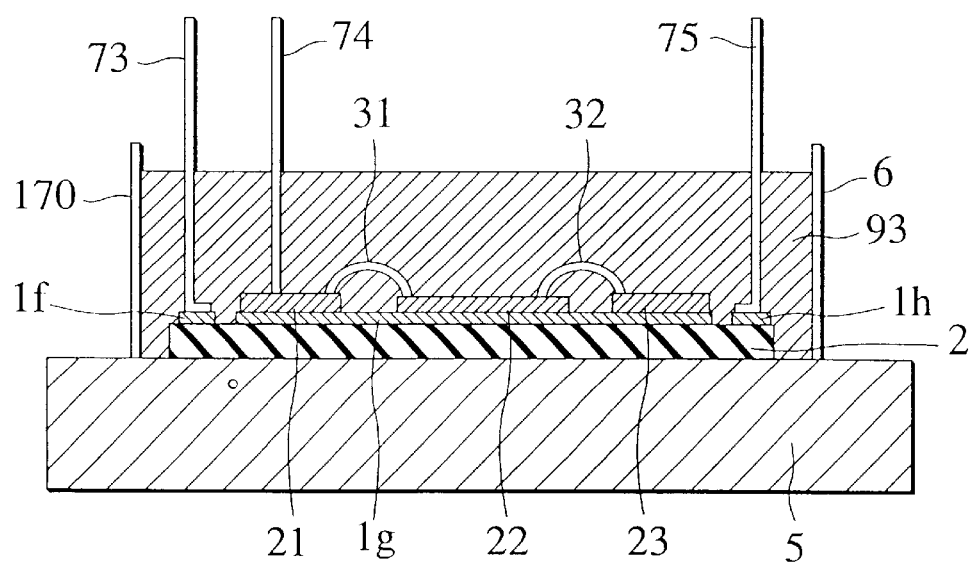
FIG. 19 is a longitudinal cross sectional view showing a package structure for a semiconductor power device according to a tenth embodiment of the present invention.

FIG. 19 is a longitudinal cross sectional view showing a structure of a package for a semiconductor power device according to a tenth embodiment. The package for semiconductor device according to the tenth embodiment comprises a heat sink (conductive bottom plate) 5, an insulating substrate 2 disposed on the heat sink (metallic base) 5, inner patterns 1f, 1g, 1h formed of a conductive film, semiconductor power chips 21 and 23 and control circuitry chip 22 merging control circuitry for controlling these semiconductor power chips 21 and 23 disposed on the inner pattern 1g, external terminals 73 and 75 connected onto the insulating substrate 2, and an injection-molded outer case 6 provided on the heat sink (metallic base) 5 to surround the insulating substrate 2. The conductive film formed on the top surface of the insulating substrate 2 may be a copper (Cu) film, or a composite film comprising gold (Au) and nickel (Ni) films. In FIG. 19, though the bottom conductive film is omitted, such bottom conductive film can be attached at the bottom of the insulating substrate 2 as shown in the first to third embodiments employing the DBC substrate. The semiconductor power chips 21 and 23 are connected electrically with the control circuitry chip 22 via bonding wires 31 and 32. A thermoplastic insulating resin 93 is injected into the injection-molded outer case 6 to seal the device constituents on the insulating substrate 2. External connection ends of the external terminals 73, 75 and an external terminal 74 are drawn out to an upper portion of the package through the thermoplastic insulating resin 93 which is formed by injection-molding.

A method for manufacturing the package for semiconductor device according to the tenth embodiment of the present invention will be explained below with reference to cross sectional process diagrams shown in FIGS. 20A to 20D.

Figure 20A:
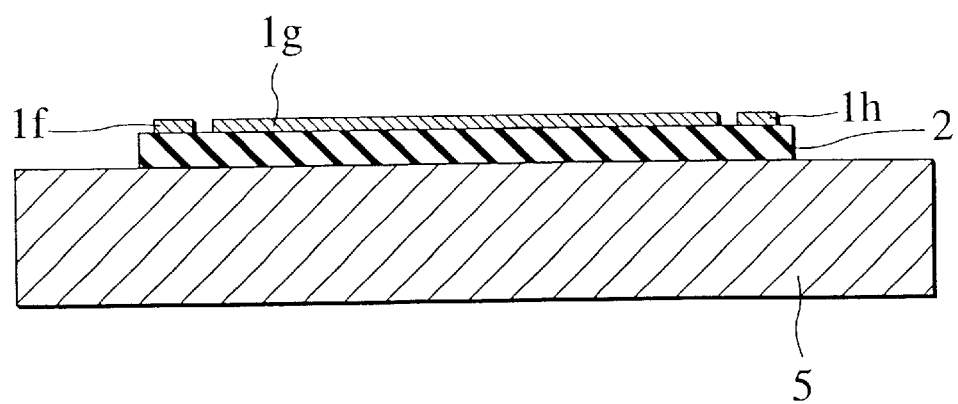
FIGS. 20A to 20D are cross sectional process views showing a method for manufacturing the semiconductor device according to the tenth embodiment of the present invention.

(a) At first, an insulating substrate 2 on which the conductive film is formed is prepared. The conductive film may be formed by means of the DBC technology, or known thick film technology or a known thin film technology employing electroplating, spattering, vacuum evaporation, etc. Then the conductive film on the insulating substrate 2 is delineated to form desired inner patterns 1f, 1g, 1h by a known photolithography technology or other etching technology as shown in FIG. 20A. Thereafter, the insulating substrate 2 is bonded to a heat sink (conductive bottom plate) 5 by a solder or a conductive adhesive as shown in FIG. 20A.

Figure 20B:
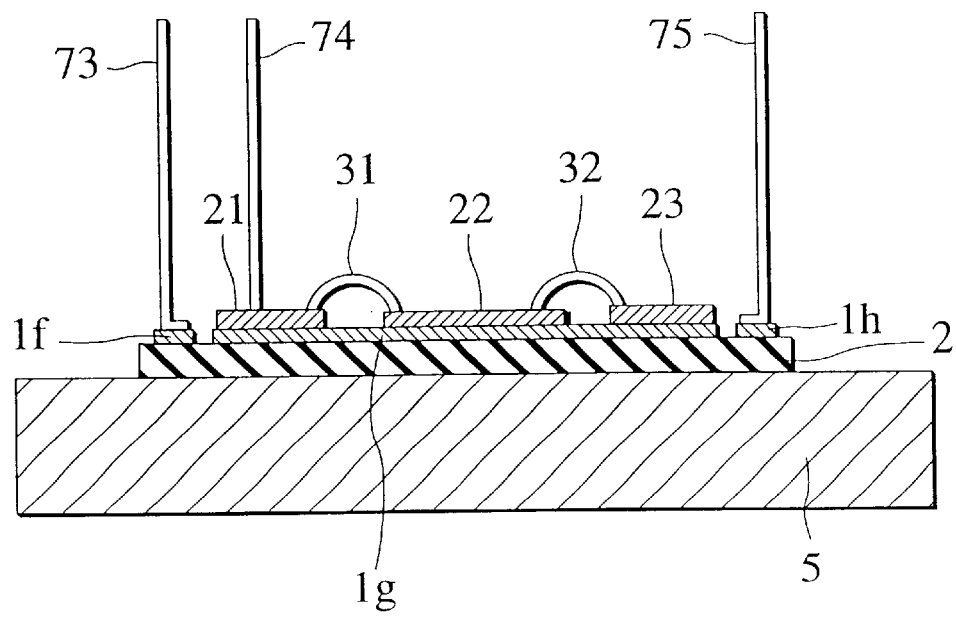

(b) Next, semiconductor power chips 21, 23 and a control circuitry chip 22 are mounted on inner patterns 1g as shown in FIG. 20B. Then, by the wire bonding technology, the semiconductor power chip 21 and the control circuitry chip 22 are mutually connected electrically with circuit wires (the bonding wires) 31. Similarly, the semiconductor power chip 23 and the control circuitry chip 22 are mutually connected electrically with the bonding wires 32. Thereafter, as shown in FIG. 20B, external terminals 73 and 75 are provided on the inner patterns 1f and 1h serving as electrode plates.

Figure 20C:
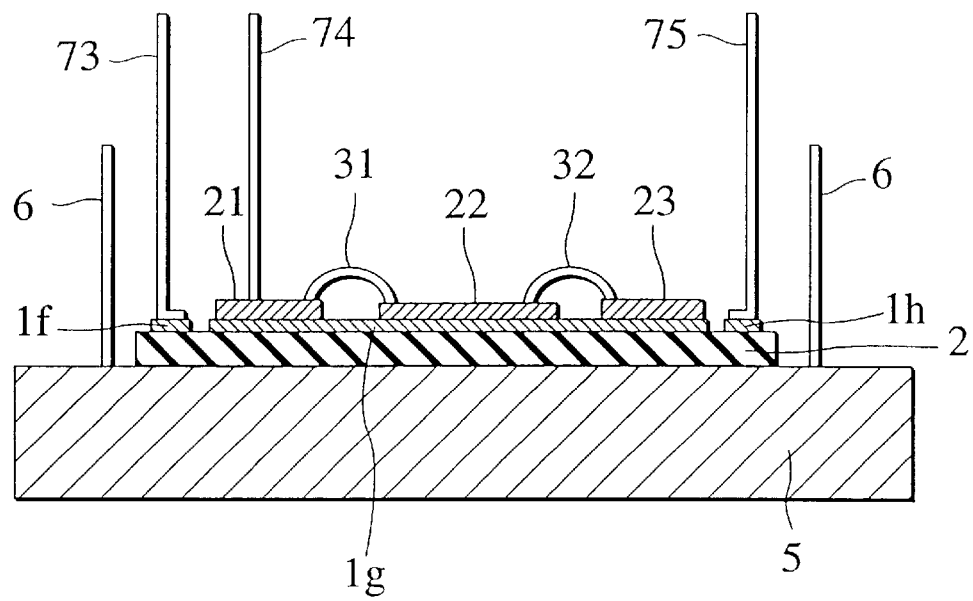

(c) Then, an insulating resin is injection-molded onto the conductive bottom plate 5 to form an outer case 6 made of the resin as shown in FIG. 20C.

Figure 20D:
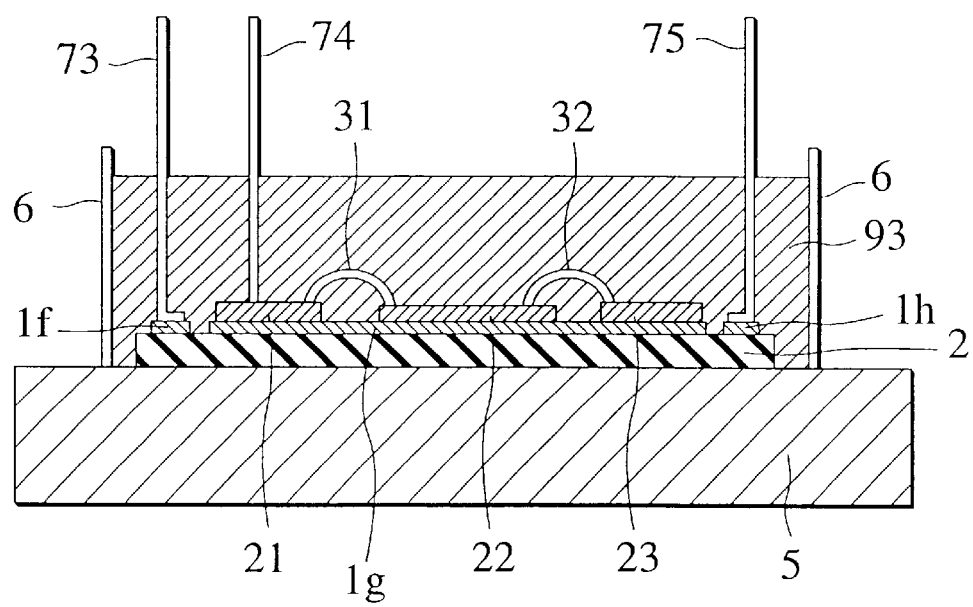

(d) Finally, a thermoplastic insulating resin 93 is injected into the outer case 6 made of the insulating resin as shown in FIG. 20D to finish the package for semiconductor device according to the tenth embodiment of the present invention.

As described above, the structure of the package for semiconductor device according to the tenth embodiment of the present invention has the outer case 6 that is formed by injection-molding the insulating resin onto the heat sink (conductive bottom plate) 5 so as to integrate the outer case 6 made of the insulating resin and the heat sink (conductive bottom plate) 5 together. Thus, the adhesion between the outer case 6 made of the insulating resin and the heat sink (conductive bottom plate) 5 can be improved compared to the conventional package for semiconductor device, and the moisture penetration into the package can be prevented. The step (c) for injection-molding the insulating resin shown in FIG. 20C may be performed prior to bonding the insulating substrate onto the conductive bottom plate.

(Other Embodiments)

Various modifications will become possible for those skilled in the art after receiving the teachings of the present disclosure without departing from the scope thereof.

Whereas the DBC substrate that is formed by attaching the copper film on the AlN substrate is employed in the above explanation, an AlN substrate 2 with an aluminum film attached thereon instead of the copper film 1 may also be employed. Or, a substrate that exposes entire surface of an insulating substrate may also be adopted. Further, miscellaneous substrates having various metallic patterns formed on insulating substrates by thick film or thin film technologies may be adopted.

In the first through tenth embodiments, the IPM on which mounted the semiconductor power chips 21, 23 and the control circuitry chip 22 for controlling these semiconductor power chips 21 and 23 is explained. However, the number of the semiconductor power chips may be three or more, and may also be one. The present invention may also be applied to a package without a control circuitry chip. Although the configuration in which the control circuitry chip is disposed at the center is exemplified, these locations are variable to any position in accordance with the package design. If the control circuitry chip is not employed, the semiconductor power chip can be located at the center of the insulating substrate, and electrode pads may be located on the region where the semiconductor power chips are located in the first through the tenth embodiments.

The semiconductor power chip may be a power IC such as a SMART POWER integrated circuit that monolithically integrates control circuitry and the semiconductor power devices together on the same substrate.

Any one of the first through the third embodiments can be combined with any one of the fourth through the tenth embodiments.

Whereas such the examples that employs the epoxy resin as the material of the resins 11 and 12 and the heaped member 13 are explained in the first through the third embodiments, the present invention is not limited with these examples. Namely, instead of the epoxy resin, a heat-resistant resin for suffering the heat increase of the semiconductor power chips 21, 23 and the control circuitry chip 22 can also be used to obtain the similar effects according to the present invention.

The present invention can be modified variously within the scope of the appended claims.

What is claimed is:

1. A package for a semiconductor power device, comprising:
    a conductive bottom plate serving as a heat sink;
    an insulating substrate mounted on said bottom plate, having a smooth region of a given surface roughness near a peripheral region thereof;
    a conductive film formed selectively on said insulating substrate, for mounting a semiconductor chip thereon; and
    an insulating material formed on said semiconductor chip.

2. The package of claim 1, wherein said smooth region is formed at a top surface of the said peripheral region of the insulating substrate, and said conductive film is located so as to expose said smooth region.

3. The package of claim 1, wherein said smooth region is formed at a bottom surface of the said peripheral region of the insulating substrate, and said conductive film is located so as to expose a top surface region of said insulating substrate opposing to said smooth region.

4. The package of claim 1, wherein a solidified insulating material is disposed on an outer edge region of said conductive film and said peripheral region of said insulating substrate.

5. A package for a semiconductor power device, comprising:
    a conductive bottom plate serving as a heat sink, said bottom plate having a notch arranged in a peripheral region of a surface thereof;
    an insulating substrate mounted on said bottom plate;
    a conductive film formed on said insulating substrate selectively to expose a peripheral region of said insulating substrate, for mounting a semiconductor chip thereon; and
    an insulating material formed on said semiconductor chip.

6. The package of claim 5, wherein
    said notch is located outwardly apart from a region for mounting said semiconductor chip.

7. The package of claim 5, wherein an insulating material with a high heat conductivity is buried within said notch.

8. A package for a semiconductor power device, comprising:
    a conductive bottom plate serving as a heat sink;
    an insulating substrate mounted on said bottom plate;
    a conductive film formed on said insulating substrate selectively to expose a peripheral region of said insulating substrate, for mounting a semiconductor chip thereon;
    a container arranged on said bottom plate, surrounding said insulating substrate;
    an upper lid arranged at an upper portion of said container;
    an inlet formed at a part of said upper lid;
    an insulating material injected through said inlet to fill said container; and
    a waterproof and flexible film located at and to close said inlet.

9. The package of claim 8, wherein said waterproof and flexible film consists of a metallic film.

10. A package for a semiconductor power device, comprising:
    a conductive bottom plate serving as a heat sink;
    an insulating substrate mounted on said bottom plate;
    a conductive film formed on said insulating substrate selectively to expose a peripheral region of said insulating substrate, for mounting a semiconductor chip thereon;
    an insulating material formed on said semiconductor chip; and
    a foam provided on said insulating material.

11. A package for a semiconductor power device, comprising:
    a conductive bottom plate serving as a heat sink;
    an insulating substrate mounted on said bottom plate;
    a conductive film formed on said insulating substrate selectively to expose a peripheral region of said insulating substrate, for mounting a semiconductor chip thereon;
    a container arranged on said bottom plate, surrounding said insulating substrate;
    a jog portion formed on a side of an upper aperture of said container;

a sealing material provided in said aperture, having another jog portion corresponding to said jog portion of said aperture; and an insulating material formed on said semiconductor chip to fill said container.

12. A package for a semiconductor power device, comprising:

a conductive bottom plate serving as a heat sink;

an insulating substrate mounted on said bottom plate;

a conductive film formed on said insulating substrate selectively to expose a peripheral region of said insulating substrate, for mounting a semiconductor chip thereon;

a container arranged on said bottom plate, surrounding said insulating substrate;

an insulating material formed on said semiconductor chip to fill said container;

an upper lid arranged at an upper portion of said container;

an external terminal supported through said upper lid and connected electrically with said semiconductor chip; and an insulating sheath for covering an outer surface of said external terminal.

13. The package of claim 12, wherein said insulating sheath has a dielectric constant higher than at least that of a material of said upper lid.

14. The package of claim 12, wherein said insulating sheath has a dielectric constant higher than at least that of said insulating material.

15. A package for a semiconductor power device, comprising:

a conductive bottom plate serving as a heat sink;

an insulating substrate mounted on said bottom plate;

a conductive film formed on said insulating substrate selectively to expose a peripheral region of said insulating substrate, for mounting a semiconductor chip thereon;

a thermoplastic insulating resin formed on said semiconductor chip and at least a part of said bottom plate integrally; and an external terminal arranged through said thermoplastic insulating resin and connected electrically with said semiconductor chip.

16. The package of claim 15, wherein said thermoplastic insulating resin seals said semiconductor chip and at least a part of said bottom plate integrally.

17. The package of claim 16, wherein a recessed groove or a notch is formed in a lower portion of said bottom plate for injecting said thermoplastic resin.

18. The package of claim 15, wherein said external terminal has a curved portion for adjusting a lead-out direction from said thermoplastic resin to be coincident with a direction parallel to a main plane of said bottom plate.

19. The package of claim 15, wherein said thermoplastic insulating resin does not contact to said bottom plate.

20. The package of claim 19, wherein a surface plane of said insulating substrate has an angle of 30° to that of a molded side of said thermoplastic resin.

21. A method for assembling a package for a semiconductor power device, comprising the steps of:

(a) bonding an insulating substrate on a conductive bottom plate;

(b) mounting a semiconductor chip on said insulating substrate;

(c) connecting electrically said semiconductor chip with an external terminal;

(d) injection-molding an insulating resin on said bottom plate to form an outer case consisting of said insulating resin for surrounding said insulating substrate and said semiconductor chip; and (e) filling an insulating resin within said outer case.

* * * * *